US007763534B2

(12) United States Patent  
Smayling et al.

(10) Patent No.: US 7,763,534 B2  
(45) Date of Patent: Jul. 27, 2010

(54) METHODS, STRUCTURES AND DESIGNS FOR SELF-ALIGNING LOCAL INTERCONNECTS USED IN INTEGRATED CIRCUITS

(75) Inventors: Michael C. Smayling, Fremont, CA (US); Scott T. Becker, Scotts Valley, CA (US)

(73) Assignee: Tela Innovations, Inc., Campbell, CA (US)

( * ) Notice: Subject to any disclaimer, the term of this patent is extended or adjusted under 35 U.S.C. 154(b) by 156 days.

(21) Appl. No.: 11/969,854

(22) Filed: Jan. 4, 2008

(65) Prior Publication Data

US 2009/0108360 A1    Apr. 30, 2009

Related U.S. Application Data

(60) Provisional application No. 60/983,091, filed on Oct. 26, 2007.

(51) Int. Cl.  
H01L 21/44    (2006.01)

(52) U.S. Cl. .................. 438/599; 257/E27.06; 257/368

(58) Field of Classification Search .................. 438/599  
See application file for complete search history.

(56) References Cited

U.S. PATENT DOCUMENTS

| | | | | |
|---|---|---|---|---|
| 4,197,555 | A | 4/1980 | Uehara et al. ................. | 357/70 |
| 5,378,649 | A | 1/1995 | Huang .......................... | 437/52 |
| 5,581,098 | A | 12/1996 | Chang ......................... | 257/211 |
| 5,682,323 | A | 10/1997 | Pasch et al. ................. | 364/491 |
| 5,684,733 | A | 11/1997 | Wu et al. ..................... | 365/100 |
| 5,825,203 | A | 10/1998 | Kusunoki et al. ............. | 326/41 |
| 5,841,663 | A | 11/1998 | Sharma et al. .............. | 364/490 |
| 5,847,421 | A | 12/1998 | Yamaguchi ................. | 257/207 |
| 5,898,194 | A | 4/1999 | Gheewala ................... | 257/206 |

(Continued)

FOREIGN PATENT DOCUMENTS

WO    WO 2006/014849    2/2006

OTHER PUBLICATIONS

Hayashida, et al.; Manufactuable Local Interconnect Technology Fully Compatible With Titanium Salicide Progess; Jun. 11-12, 1991; VMIC Conference.

(Continued)

*Primary Examiner*—W. David Coleman  
*Assistant Examiner*—Sonya D McCall-Shepard  
(74) *Attorney, Agent, or Firm*—Martine Penilla & Gencarella, LLP

(57) ABSTRACT

Methods, structures and designs for self-aligned local interconnects are provided. The method includes designing diffusion regions to be in a substrate. Some of a plurality of gates are designed to be active gates and some of the plurality of gates are designed to be formed over isolation regions. The method includes designing the plurality of gates in a regular and repeating alignment along a same direction, and each of the plurality of gates are designed to have dielectric spacers. The method also includes designing a local interconnect layer between or adjacent to the plurality of gates. The local interconnect layer is conductive and disposed over the substrate to allow electrical contact and interconnection with or to some of the diffusion regions of the active gates. The local interconnect layer is self-aligned by the dielectric spacers of the plurality of gates.

19 Claims, 20 Drawing Sheets

U.S. PATENT DOCUMENTS

| | | | |
|---|---|---|---|
| 5,908,827 A | 6/1999 | Sirna | 514/12 |
| 5,923,059 A | 7/1999 | Gheewala | 257/204 |
| 5,935,763 A | 8/1999 | Caterer et al. | 430/313 |
| 5,977,305 A | 11/1999 | Wigler et al. | 530/350 |
| 6,100,025 A | 8/2000 | Wigler et al. | 435/6 |
| 6,174,742 B1 | 1/2001 | Sudhindranath et al. | 438/14 |
| 6,182,272 B1 | 1/2001 | Andreev et al. | 716/13 |
| 6,194,252 B1 | 2/2001 | Yamaguchi | 438/129 |
| 6,194,912 B1 | 2/2001 | Or-Bach | 326/38 |
| 6,240,542 B1 | 5/2001 | Kapur | 716/12 |
| 6,255,600 B1 | 7/2001 | Schaper | 174/255 |
| 6,275,973 B1 | 8/2001 | Wein | 716/10 |
| 6,331,733 B1 | 12/2001 | Or-Bach et al. | 257/758 |
| 6,335,250 B1 | 1/2002 | Egi | 438/300 |
| 6,338,972 B1 | 1/2002 | Sudhindranath et al. | 438/14 |
| 6,388,296 B1 | 5/2002 | Hsu | 257/377 |
| 6,416,907 B1 | 7/2002 | Winder et al. | 430/5 |
| 6,425,117 B1 | 7/2002 | Pasch et al. | 716/21 |
| 6,436,805 B1 * | 8/2002 | Trivedi | 438/618 |
| 6,476,493 B2 | 11/2002 | Or-Bach et al. | 257/758 |
| 6,480,989 B2 | 11/2002 | Chan et al. | 716/8 |
| 6,505,327 B2 | 1/2003 | Lin | 716/5 |
| 6,525,350 B1 | 2/2003 | Kinoshita et al. | 257/202 |
| 6,536,028 B1 | 3/2003 | Katsioulas et al. | 716/17 |
| 6,571,140 B1 | 5/2003 | Wewalaarachchi et al. | 700/83 |
| 6,590,289 B2 | 7/2003 | Shively | 257/758 |
| 6,591,207 B2 | 7/2003 | Naya et al. | 702/81 |
| 6,620,561 B2 | 9/2003 | Winder et al. | 430/5 |
| 6,661,041 B2 | 12/2003 | Keeth | 257/211 |
| 6,691,297 B1 | 2/2004 | Misaka et al. | 716/21 |
| 6,714,903 B1 | 3/2004 | Chu et al. | 703/19 |
| 6,737,199 B1 | 5/2004 | Hsieh | 430/5 |
| 6,737,347 B1 | 5/2004 | Houston et al. | 438/633 |
| 6,745,372 B2 | 6/2004 | Cote et al. | 716/2 |
| 6,792,593 B2 | 9/2004 | Takashima et al. | 716/21 |
| 6,795,952 B1 | 9/2004 | Stine et al. | 716/5 |
| 6,807,663 B2 | 10/2004 | Cote et al. | 716/21 |
| 6,819,136 B2 | 11/2004 | Or-Bach | 326/41 |
| 6,834,375 B1 | 12/2004 | Stine et al. | 716/2 |
| 6,850,854 B2 | 2/2005 | Naya et al. | 702/81 |
| 6,854,100 B1 | 2/2005 | Chuang et al. | 716/5 |
| 6,877,144 B1 | 4/2005 | Rittman et al. | 716/10 |
| 6,884,712 B2 | 4/2005 | Yelehanka et al. | 438/622 |
| 6,904,582 B1 | 6/2005 | Rittman et al. | 716/10 |
| 6,928,635 B2 | 8/2005 | Pramanik et al. | 716/21 |
| 6,931,617 B2 | 8/2005 | Sanie et al. | 716/18 |
| 6,953,956 B2 | 10/2005 | Or-Bach et al. | 257/203 |
| 6,978,437 B1 | 12/2005 | Rittman et al. | 716/10 |
| 6,992,925 B2 | 1/2006 | Peng | 365/177 |
| 7,028,285 B2 | 4/2006 | Cote et al. | 716/21 |
| 7,041,568 B2 | 5/2006 | Goldbach et al. | 438/387 |
| 7,064,068 B2 | 6/2006 | Chou et al. | 438/687 |
| 7,093,228 B2 | 8/2006 | Andreev et al. | 716/21 |
| 7,103,870 B2 | 9/2006 | Misaka et al. | 716/21 |
| 7,120,882 B2 | 10/2006 | Kotani et al. | 716/5 |
| 7,137,092 B2 | 11/2006 | Maeda | 716/8 |
| 7,149,999 B2 | 12/2006 | Kahng et al. | 716/19 |
| 7,155,689 B2 | 12/2006 | Pierrat | 716/4 |
| 7,278,118 B2 | 10/2007 | Pileggi et al. | 716/1 |
| 2003/0042930 A1 | 3/2003 | Pileggi et al. | 326/41 |
| 2004/0145028 A1 | 7/2004 | Matsumoto et al. | 257/620 |
| 2004/0161878 A1 | 8/2004 | Or-Bach et al. | 438/113 |
| 2004/0243966 A1 | 12/2004 | Dellinger | 716/17 |
| 2005/0055828 A1 | 3/2005 | Wang et al. | 29/857 |
| 2005/0101112 A1 | 5/2005 | Rueckes et al. | 438/584 |
| 2005/0189614 A1 | 9/2005 | Ihme et al. | 257/532 |
| 2005/0224982 A1 | 10/2005 | Kemerling et al. | 257/758 |
| 2006/0112355 A1 | 5/2006 | Pileggi et al. | 716/1 |
| 2006/0121715 A1 | 6/2006 | Chang et al. | |
| 2006/0151810 A1 | 7/2006 | Ohshige | 257/207 |
| 2006/0223302 A1 | 10/2006 | Chang et al. | |

OTHER PUBLICATIONS

Acar, et al., "A Linear-Centric Simulation Framework for Parametric Fluctuations", 2002, IEEE, Carnegie Mellon University USA, pp. 1-8.

Amazawa, et al., "Fully Planarized Four-Level Interconnection with Stacked VLAS Using CMP of Selective CVD-A1 and Insulator and its Application to Quarter Micron Gate Array LSIs", 1995, IEEE, Japan, pp. 473-476.

Burkhardt, et al., "Dark Field Double Dipole Lithography (DDL) for Back-End-Of-Line Processes", 2007, SPIE Proceeding Series, vol. 6520; 65200K.

Capetti, et al., "Sub k1=0.25 Lithography with Double Patterning Technique for 45nm Technology Node Flash Memory Devices at λ=193nm", 2007, SPIE Proceeding Series, vol. 6520; 65202K.

Chandra, et al., "An Interconnect Channel Design Methodology for High Performance Integrated Circuits", 2004, IEEE, Carnegie Mellon University, pp. 1-6.

Cheng, et al., "Feasibility Study of Splitting Pitch Technology on 45nm Contact Paterning with 0.93 NA", 2007, SPIE Proceeding Series, vol. 6520; 65202N.

Chow, et al., "The Design of a SRAM-Based Field-Programmable Gate Array—Part II: Circuit Design and Layout", 1999, IEEE, vol. 7 # 3 pp. 321-330.

DeVor, et al., "Statistical Quality Design and Control", 1992, Macmillan Publishing Company, pp. 264-267.

Dusa, et al. "Pitch Doubling Through Dual Patterning Lithography Challenges in Integration and Litho Budgets", 2007, SPIE Proceeding Series, vol. 6520; 65200G.

El-Gamal, "Fast, Cheap and Under Control: The Next Implementation Fabric", Jun. 2-6, 2003, ACM Press, pp. 354-355.

Frankel, "Quantum State Control Interference Lithography and Trim Double Patterning for 32-16nm Lithography", 2007, SPIE Proceeding Series, vol. 6520; 65202L.

Heng, et al., "A VLSI Artwork Legalization Technique Base on a New Criterion of Minimum Layout Perturbation", 1997, ACM Press, pp. 116-121.

Hu, et al., "Synthesis and Placemant Flow for Gain-Based Programmable Regular Fabrics", Apr. 6-9, 2003, ACM Press, pp. 197-203.

Hutton, et al., "A Methodology for FPGA to Structured-ASIC Synthesis and Verification", 2006, EDAA, pp. 64-69.

Jayakumar, et al., "A Metal and VIA Maskset Programmable VLSI Design Methodology using PLAs", 2004, IEEE, pp. 590-594.

Kheterpal, et al., "Routing Architecture Exploration for Regular Fabrics", DAC, Jun. 7-11, 2004, ACM Press, pp. 204-207.

Kheterpal, et al., "Design Methodolgy for IC Manufactrability Based on Regular Logic-Bricks", DAC, Jun. 13-17, 2005, IEEE/AMC, vol. 6520.

Kim, et al., "Issues and Challenges of Double Patterning Lithography in DRAM", 2007, SPIE Proceeding Series, vol. 6520; 65200H.

Kim, et al., "Double Exposure Using 193nm Negative Tone Photoresist", 2007, SPIE Proceeding Series, vol. 6520; 65202M.

Koorapaty, et al., "Heterogeneous Logic Block Architectures for Via-Patterned Programmable Fabric", 13th International Conference on Field Programmable Logic and Applications (FPL) 2003, Lecture Notes in Computer Science (LNCS), Sep. 2003, Springer-Verlag, vol. 2778, pp. 426-436.

Koorapaty, et al., "Modular, Fabric-Specific Synthesis for Programmable Architectures", 12th International Conference on Field Programmable Logic and Applications (FPL_2002, Lecture Notes in Computer Science (LNCS)), Sep. 2002, Springer-Verlag, vol. 2438 pp. 132-141.

Koorapaty, et al., "Exploring Logic Block Granularity for Regular Fabrics", 2004, IEEE, pp. 1-6.

Li, et al., "A Linear-Centric Modeling Approach to Harmonic Balance Analysis", 2002, IEEE, pp. 1-6.

Li, et al., "Nonlinear Distortion Analysis Via Linear-Centric Models", 2003, IEEE, pp. 897-903.

Liebmann et al., "Integrating DfM Components Into a Cohesive Design-To-Silicon Solution", IBM Systems and Technology Group, b IBM Research, pp. 1-12.

Liebmann, et al., "High-Performance Circuit Design for the RET-Enabled 65nm Technology Node", Feb. 26-27, 2004, SPIE Proceeding Series, vol. 5379 pp. 20-29.

Liu, et al., "Double Patterning with Multilayer Hard Mask Shrinkage for Sub-0.25 kl Lithography", 200, SPIE Proceeding Series, vol. 6520; 65202J.

Mo, et al., "Checkerboard: A Regular Structure and its Synthesis, International Workshop on Logic and Synthesis", 2003, Department of Electrical Engineering and Computer Sciences, UC Berkeley, California, pp. 1-7.

Mo, et al., "PLA-Based Regular Structures and Their Synthesis", 2003, Department of Electrical Engineering and Computer Sciences, IEEE, pp. 723-729.

Mo, et al., "Regular Farbrics in Deep Sub-Micron Integrated-Circuit Design", 2004, Kluwer Academic Publishers, Entire Book.

Op de Beek, et al., "Manufacturability issues with Double Patterning for 50nm half pitch damscene applications, using RELACS® shrink and corresponding OPC", 2007, SPIE Proceeding Series, vol. 6520; 65200I.

Or-Bach, "Programmable Circuit Fabrics", Sep. 18, 2001, e-ASIC, pp. 1-36.

Otten, et al., "Planning for Performance", DAC 1998, ACM Inc., pp. 122-127.

Pandini, et al., "Congestion-Aware Logic Synthesis", 2002, IEEE, pp. 1-8.

Pandini, et al., "Understanding and Addressing the Impact of Wiring Congestion During Technology Mapping", ISPD Apr. 7-10, 2002, ACM Press, pp. 131-136.

Patel, et al., "An Architectural Exploration of Via Patterned Gate Arrays, ISPD 2003", Apr. 6, 2003, pp. 184-189.

Pileggi, et al., "Exploring Regular Fabrics to Optimize the Performance-Cost Trade-Offs, Proceedings of the 40th ACM/IEEE Design Automation Conference (DAC) 2003", Jun. 2003, ACM Press, pp. 782-787.

Poonawala, et al., "ILT for Double Exposure Lithography with Conventional and Novel Materials", 2007, SPIE Proceeding Series, vol. 6520; 65202Q.

Ran, et al., "Designing a Via-Configurable Regular Fabric", Custom Integrated Circuits Coference (CICC). Proceedings of the IEEE, Oct. 2004, Oct. 1, 2004, pp. 423-426.

Ran, et al., "On Designing Via-Configurable Cell Blocks for Regular Fabrics" Proceedings of the Design Automation Conference (DAC) 2004, Jun. 2004, ACM Press, s 198-203.

Ran, et al., "An Integrated Design Flow for a Via-Configurable Gate Array", 2004, IEEE, pp. 582-589.

Ran, et al., "Via-Configurable Routing Architectures and Fast Design Mappability Estimation for Regular Fabrics", 2005, IEEE, pp. 25-32.

Ran, et al., "The Magic of a Via-Configurable Regular Fabric", Proceedings of the IEEE International Conference on Computer Design (ICCD) Oct. 2004.

Reis, et al., "Physical Design Methodologies for Performance Predictability and Manufacturability", Apr. 14-16, 2004, ACM Press, pp. 390-397.

Robertson, et al., "The Modeling of Double Patterning Lithographic Processes", 2007, SPIE Proceeding Series, vol. 6520; 65200J.

Rovner, "Design for Manufacturability in Via Programmable Gate Arrays", May 2003, Graduate School of Cagegie Mellon University.

Sengupta, "An Integrated CAD Framework Linking VLSI Layout Editors and Process Simulators", 1998, Thesis for Rice University, pp. 1-101.

Sengupta, et al., "An Integrated CAD Framework Linking VLSI Layout Editors and Process Simulators", 1996, SPIE Proceeding Series, vol. 2726; pp. 244-252.

Sherlekar, "Design Considerations for Regular Fabrics", Apr. 18-21, 2004, ACM Press, pp. 97-102.

Stapper, "Modeling of Defects in Integrated Circuit Photolithographic Patterns", Jul. 1, 1984, IBM, vol. 28 # 4, pp. 461-475.

Taylor, et al., "Enabling Energy Efficiency in Via-Patterned Gate Array Devices", Jun. 7-11, 2004, ACM Press, pp. 874-877.

Tong, et al., "Regular Logic Fabrics for a Via Patterned Gate Array (VPGA), Custom Integrated Circuits Conference", Sep. 2003, Proceedings of the IEEE, pp. 53-56.

Vanleehgove, et al., "A Litho-Only Approach to Double Patterning", 2007, SPIE Proceeding Series, vol. 6520; 65202F.

Wenren, et al., "The Improvement of Photolithographic Fidelity of Two-dimensional Structures Though Double Exposure Method", 2007, SPIE Proceeding Series, vol. 6520; 65202I.

Wilcox, et al., "Design for Manufacturability: A Key to Semiconductor Manufacturing Excellence", 1998, IEEE, pp. 308-313.

Wu, et al., "A Study of Process Window Capabilities for Two-dimensional Structures under Double Exposure Condition", 2007, SPIE Proceeding Series, vol. 6520; 65202O.

Xiong, et al., "The Constrained Via Minimization Problem for PCB and VLSI Design", 1988, ACM Press/IEEE, pp. 573-578.

Yamamaoto, et al., "New Double Exposure Technique without Alternating Phase Shift Mask", 2007, SPIE Proceeding Series, vol. 6520; 652052P.

Yang, et al., "Interconnection Driven VLSI Module Placement Based on Quadratic Programming and Considering Congestion Using LFF Principles", 2004, IEEE, pp. 1243-1247.

Yao, et al., "Multilevel Routing With Redundant Via Insertion", Oct. 2006, IEEE, pp. 1148-1152.

Zheng, et al."Modeling and Analysis of Regular Symmetrically Structured Power/Ground Distribution Networks", DAC, Jun. 10-14, 2002, ACM Press, pp. 395-398.

Zhu, et al., "A Study of Double Exposure Process Design with Balanced Performance Parameters for Line/Space Applications", 2007, SPIE Proceeding Series, vol. 6520; 65202H.

Zuchowski, et al., "A Hybrid ASIC and FPGA Architecture", 2003, IEEE, pp. 187-194.

U.S. Appl. No. 60/625,342, filed May 25, 2006, Pileggi et al., Entire document.

Wang, J. et al., Statndard Cell Layout with Regular Contact Placement, IEEE Trans. on Semicon. Mfg., vol. 17, No. 3, Aug. 2004.

Kang, S.M., Metal-Metal Matrix (M3) for High-Speed MOS VLSI Layout, IEEE Trans. on CAD, vol. CAD-6, No. 5, Sep. 1987.

Liebmann, L. W., Layout Impact of Resolution Enhancement Techniques: Impediment or Opportunity?, International Symposium on Physical Design, 2003.

Jhaveri, T. et al., Maximization of Layout Printability/Manufacturability by Extreme Layout Regularity, Proc. of the SPIE, Apr. 2006.

* cited by examiner

METHODS, STRUCTURES AND DESIGNS FOR SELF-ALIGNING LOCAL INTERCONNECTS USED IN INTEGRATED CIRCUITS

CLAIM OF PRIORITY

This application claims priority to U.S. Provisional Patent Application 60/983,091 filed on Oct. 26, 2007, entitled "Methods, Structures and Designs For Self-Aligning Local Interconnects used in Integrated Circuits", and his herein incorporated by reference.

CROSS REFERENCE AND RELATED APPLICATIONS

This application is related to co-pending U.S. patent application Ser. No. 11/683,402 filed on Mar. 7, 2007, entitled "Dynamic Array Architecture" by Becker et al., which is incorporated herein by reference for all purposes.

FIELD OF THE INVENTION

The present invention generally relates to integrated circuits and particularly, but without limitation, to the design and fabrication of self-aligned local interconnects for interconnecting semiconductor devices in an integrated circuit.

BACKGROUND

As semiconductor technology continues to advance, a continuing trend is towards ultra large-scale integration with the fabrication of smaller and smaller integrated circuits containing more and more devices on a single semiconductor chip.

Scaling of devices has long been used to increase the density of logic and memory functions. This scaling has been possible because of improvements in photolithography and other process steps. However, as optical lithography reaches the end of the cost effective improvement curve, other approaches to improve density are needed.

Interconnect provides connections between NMOS and PMOS transistors and other components such as resistors and capacitors in a semiconductor chip. Interconnects are generally fabricated by first depositing and planarizing dielectric layers on the semiconductor devices and passive components. Next, feed-thrus are formed in the dielectric layers. Finally, conductors are formed and routed over the dielectric layers to connect the feed-thrus. A stack is formed of multiple layers of dielectrics, feed-thrus, and conductors to complete the circuit node interconnection. This process of fabricating interconnects is generally termed "metallization". As the density of devices on the semiconductor chip is increased, the complexity of metallization has also increased.

Local interconnects can be a special form of interconnects. Local interconnects are generally used for short distances, such as within a functional cell. Conventional circuits use the same interconnect levels for both local and global connections.

Traditionally, diffusion regions to Vdd and Vss contacts require fabricating L shaped or T shaped bent diffusion regions extending towards Vdd and Vss lines from PMOS and NMOS diffusion regions respectively. The bent regions are not preferred because they require more costly photolithography equipment to fabricate. Alternatively, Vdd and Vss rails may be extended over rectangular diffusion regions and contacts may be formed to the diffusion regions. However, it is inefficient to have the power rails over the diffusion regions because they occupy tracks that could be used for signals and they are no longer located at a cell boundary so they can not be shared between vertically adjacent cells.

It is within this context that embodiments of the invention arise.

SUMMARY

Broadly speaking, embodiments of the present invention defines methods of fabrication, structures, layouts, design methodologies, and conductive structures to enable the definition of local interconnects of a circuit. The local interconnects, in accordance with embodiments of the present invention, are referred to herein as "self-aligned" local interconnects, as they align, in response to the fabrication process, in channels or regions between or beside gate electrodes. The local interconnects, are ones defined in the self-aligned orientation that can be patterned to remove some of the material, leaving only those portions that are needed to complete selected local interconnections.

One of many beneficial features is that a circuit layout can be done with rectangular or substantially diffusion regions. These rectangular diffusion regions can be fabricated with better fidelity than diffusion regions with bends or extensions. Additionally, the self-aligned local interconnects can be used to make the power connections (i.e., Vdd and Vss) with the source and drains of transistors, without requiring diffusion region extensions. Self-aligned local interconnects can also eliminate the need for certain contacts to transistor diffusion regions. As will be described in greater detail below, the local interconnects make direct and integral contact with the diffusion regions. Thus, the local interconnects provide previously unavailable metal routing on the substrate level, which serves to eliminate the need for certain first metal tracks, certain vias, and in some cases, a second metal track (e.g., for connections between NMOS transistor source/drains and PMOS transistor source/drains).

Still further, by eliminating traditional diffusion contacts in active transistor channels, the strain layer in the diffusion regions are not altered. This improves the effectiveness of mobility enhancing strain layers. In addition, allowing the diffusion contacts to be connected to a wider choice of metal-1 tracks gives more flexibility in circuit design, thus enhancing layout and making for more efficient place & route.

In one embodiment, a method for designing local interconnect structures is disclosed. The method includes designing diffusion regions to be in a substrate. Some of a plurality of gates are designed to be active gates and some of the plurality of gates are designed to be formed over isolation regions. The method includes designing the plurality of gates in a regular and repeating alignment along a same direction, and each of the plurality of gates are designed to have dielectric spacers. The method also includes designing a local interconnect layer between or adjacent to the plurality of gates. The local interconnect layer is conductive and disposed over the substrate to allow electrical contact and interconnection with or to some of the diffusion regions of the active gates. The local interconnect layer is self-aligned by the dielectric spacers of the plurality of gates.

The advantages of the present inventions are numerous. Most notably, the self-aligned local interconnects permit diffusion region with fewer bends, extensions, etc. The self-aligned local interconnects also reduces the number of contacts needed, metal 1 track usage, number of vias needed to make contact to diffusions, and in turn metal 2 track usage. Thus, more tracks are opened up for routing. Furthermore, use of the self-aligned local interconnects reduces use of metal to diffusion contacts, which reduces interference with strain materials on the substrate. Thus, by eliminating most metal to diffusion regions, device efficiency is boosted significantly. The self-aligned local interconnect also provide more flexibility in metal-1 track assignments for connections within a cell or cells, improving density and simplifying subsequent place and route.

Another advantage of the self-aligning process for the fabrication of local interconnects over photo aligned process is that the fabrication of the self-aligned local interconnects does not require dependence on the lithography for aligning the local interconnects with the side wall spacers of the gates. It is well known that the lithography has a margin of error, hence, even if minor shift in the local interconnect layer towards the side wall spacers of the gates in the integrated circuit may "short" the device or will result in an unwanted outcome.

Other aspects and advantages of the present inventions will become apparent from the following detailed description, taken in conjunction with the accompanying drawings, illustrating by way of example the principles of the present invention.

BRIEF DESCRIPTION OF DRAWINGS

The present invention will be readily understood by the following detailed description in conjunction with the accompanying drawings. To facilitate this description, like reference numerals designate like structural elements.

DETAILED DESCRIPTION

Figure 1:
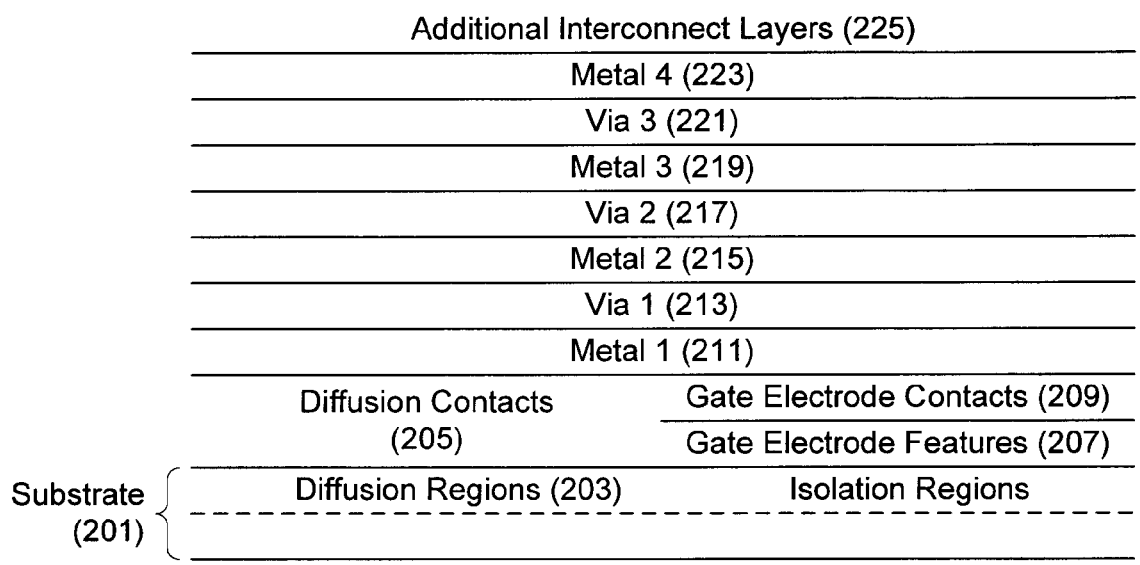
FIG. 1 shows a generalized stack of layers used to define a dynamic array architecture, in accordance with one embodiment of the present invention.

Embodiments of an invention for methods and processes for designing, layout-out, making, fabricating and implementing "self-aligned local interconnects" in integrated circuits, are disclosed. In the following description, numerous specific details are set forth in order to provide a thorough understanding of the present invention. In one embodiment, a process of fabricating self-aligned local interconnects is provided. In other embodiments, method and layout techniques are disclosed, which illustrate ways of using the self-aligned local interconnects. The benefits and advantages of using these self-aligned local interconnects are also outlined below, with specific reference to a particular logic cell. However, it should be understood that the example logic cell is not limiting on the use of local interconnects that are self-aligned. The use of self-aligned local interconnects can be extended to any circuit layout, logic device, logic cell, logic primitive, interconnect structure, design mask, etc. Therefore, in the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

The self-aligned local interconnects have numerous applications in the fabrication of integrated circuits. The self-aligning of the local interconnects in integrated circuits eliminates lithography error margins and resulting device loss, as even a minor misalignment of a local interconnect on the integrated circuit may cause an electric short and/or render the device inoperable.

Furthermore, self-aligned local interconnects may be used for various other purposes. One such purpose is to use the self-aligned local interconnects to move away metal contacts from the diffusion regions of transistors.

Additionally, the process of fabricating "self-aligned" local interconnects in integrated circuits is advantageous over other techniques, which require precise aligning through lithography processes. As is known, as feature sizes continue to shrink, the ability to accurately align masks has not kept pace. Additionally, interference patterns from neighboring shapes can create constructive or destructive interference. In the case of constructive interference, unwanted shapes may be inadvertently created. In the case of destructive interference, desired shapes may be inadvertently removed. In either case, a particular shape is printed in a different manner than intended, possibly causing a device failure. Correction methodologies, such as optical proximity correction (OPC), attempt to predict the impact from neighboring shapes and modify the mask such that the printed shape is fabricated as desired. As noted, however, the quality of the light interaction prediction is declining as process geometries shrink and as the light interactions become more complex.

With this overview in mind, the following figures will illustrate example structures, fabrication steps, layout geometries, masks, and interconnect layouts. All of which can be presented in either a layout, masks, computer files having mask definitions, and resulting layers on a semiconductor substrate. Consequently, it should be understood that the fabrication processes described below are only exemplary, and some steps may be omitted or replaced by other steps, so long as the spirit and definition of a "self-aligned" local interconnect line is maintained.

In one embodiment, the methods and structures of the present invention take advantage of a consistent feature orientation, which defines a canvas of substantially uniform feature orientations. In a canvas, a number of diffusion regions are defined within the substrate to define active regions for transistor devices. The canvas also includes a number of linear gate electrode segments oriented in a common direction over the substrate. Some of the linear gate electrode segments are disposed over a diffusion region. Each of the linear gate electrode segments that is disposed over a diffusion region includes a necessary active portion defined over the diffusion region and a uniformity extending portion defined to extend over the substrate beyond the diffusion region. Additionally, the linear gate electrode segments are defined to have variable lengths to enable logic gate functionality. The canvas further includes a number of linear conductor segments disposed within a level over the gate electrode segments, so as to cross the common direction of the gate electrode segments in a substantially perpendicular direction. The number of linear conductor segments is defined to minimize an end-to-end spacing between adjacent linear conductor segments within a common line over the substrate.

In describing the figures and explaining the embodiments, various details of the fabrication process that are well known in the art, have been left out for providing clarity and focus on the embodiments being described. Furthermore, many terms related with the fabrication process are not described in detail because these terms are well known in the art.

I. Overview of Canvas Design Implementing Consistent Relative Feature Orientation FIG. 1 is an illustration showing a generalized stack of layers used to define a dynamic array architecture, in accordance with one embodiment of the present invention. It should be appreciated that the generalized stack of layers used to define the dynamic array architecture, as described with respect to FIG. 1, is not intended to represent an exhaustive description of the CMOS manufacturing process. However, the dynamic array is to be built in accordance with standard CMOS manufacturing processes. Generally speaking, the dynamic array architecture includes both the definition of the underlying structure of the dynamic array and the techniques for assembling the dynamic array for optimization of area utilization and manufacturability. Thus, the dynamic array is designed to optimize semiconductor manufacturing capabilities.

With regard to the definition of the underlying structure of the dynamic array, the dynamic array is built-up in a layered manner upon a base substrate (e.g. semiconductor wafer) 201, e.g., upon a silicon substrate, or silicon-on-insulator (SOI) substrate. Diffusion regions 203 are defined in the base substrate 201. The diffusion regions 203 are generally separated by the isolation regions or Shallow Trench Isolation (STI) regions. The diffusion regions 203 represent selected regions of the base substrate 201 within which impurities are introduced for the purpose of modifying the electrical properties of the base substrate 201. Above the diffusion regions 203, diffusion contacts 205 are defined to enable connection between the diffusion regions 203 and conductor lines. For example, the diffusion contacts 205 are defined to enable connection between source and drain diffusion regions 203 and their respective conductor nets. Also, gate electrode features 207 are defined above the diffusion regions 203 to form transistor gates. Gate electrode contacts 209 are defined to enable connection between the gate electrode features 207 and conductor lines. For example, the gate electrode contacts 209 are defined to enable connection between transistor gates and their respective conductor nets.

Interconnect layers are defined above the diffusion contact 205 layer and the gate electrode contact layer 209. The interconnect layers include a first metal (metal 1) layer 211, a first via (via 1) layer 213, a second metal (metal 2) layer 215, a second via (via 2) layer 217, a third metal (metal 3) layer 219, a third via (via 3) layer 221, and a fourth metal (metal 4) layer 223. The metal and via layers enable definition of the desired circuit connectivity. For example, the metal and via layers enable electrical connection of the various diffusion contacts 205 and gate electrode contacts 209 such that the logic function of the circuitry is realized. It should be appreciated that the dynamic array architecture is not limited to a specific number of interconnect layers, i.e., metal and via layers. In one embodiment, the dynamic array may include additional interconnect layers 225, beyond the fourth metal (metal 4) layer 223. Alternatively, in another embodiment, the dynamic array may include less than four metal layers.

The dynamic array is defined such that layers (other than the diffusion region layer 203) are restricted with regard to layout feature shapes that can be defined therein. Specifically, in each layer other than the diffusion region layer 203, substantially linear-shaped layout features are allowed. A linear-shaped layout feature in a given layer is characterized as having a consistent vertical cross-section shape and extending in a single direction over the substrate. Some minor perpendicular extrusions would be allowed, however, if contacts need to be made to some lines, but these minor perpendicular extrusions should not constitute a substantial change in direction. Thus, the linear-shaped layout features define structures that are one-dimensionally varying. The diffusion regions 203 are not required to be one-dimensionally varying, although they are allowed to be if necessary. Specifically, the diffusion regions 203 within the substrate can be defined to have any two-dimensionally varying shape with respect to a plane coincident with a top surface of the substrate. In one embodiment, the number of diffusion bend topologies is limited such that the interaction between the bend in diffusion and the conductive material, e.g., polysilicon, that forms the gate electrode of the transistor is predictable and can be accurately modeled. The linear-shaped layout features in a given layer are positioned to be parallel with respect to each other. Thus, the linear-shaped layout features in a given layer extend in a common direction over the substrate and parallel with the substrate.

In one embodiment, the underlying layout methodology of the dynamic array may (but does not have to) use constructive light interference of light waves in the lithographic process to reinforce exposure of neighboring shapes in a given layer. Therefore, the spacing of the parallel, linear-shaped layout features in a given layer is designed around the constructive light interference of the standing light waves such that lithographic correction (e.g., OPC/RET) is minimized or eliminated. Thus, in contrast to conventional OPC/RET-based lithographic processes, the dynamic array defined herein exploits the light interaction between neighboring features, rather than attempting to compensate for the light interaction between neighboring features.

Because the standing light wave for a given linear-shaped layout feature can be accurately modeled, it is possible to predict how the standing light waves associated with the neighboring linear-shaped layout features disposed in parallel in a given layer will interact. Therefore, it is possible to predict how the standing light wave used to expose one linear-shaped feature will contribute to the exposure of its neighboring linear-shaped features. Prediction of the light interaction between neighboring linear-shaped features enables the identification of an optimum feature-to-feature spacing such that light used to render a given shape will reinforce its neighboring shapes. The feature-to-feature spacing in a given layer is defined as the feature pitch, wherein the pitch is the center-to-center separation distance between adjacent linear-shaped features in a given layer.

In one embodiment, to provide the desired exposure reinforcement between neighboring features, the linear-shaped layout features in a given layer are spaced such that constructive and destructive interference of the light from neighboring features will be optimized to produce the best rendering of all features in the neighborhood. The feature-to-feature spacing in a given layer is proportional to the wavelength of the light used to expose the features. The light used to expose each feature within about a five light wavelength distance from a given feature will serve to enhance the exposure of the given feature to some extent. The exploitation of constructive interference of the light waves used to expose neighboring features enables the manufacturing equipment capability to be maximized and not be limited by concerns regarding light interactions during the lithography process.

As discussed above, the dynamic array incorporates a restricted topology in which the features within each layer (other than diffusion) are required to be substantially linear in shape, and are oriented in a parallel manner to traverse over the substrate in a common direction. With the restricted topology of the dynamic array, the light interaction in the photolithography process can be optimized such that an accurate transfer of the layout onto the resist is achieved.

Figure 2A:
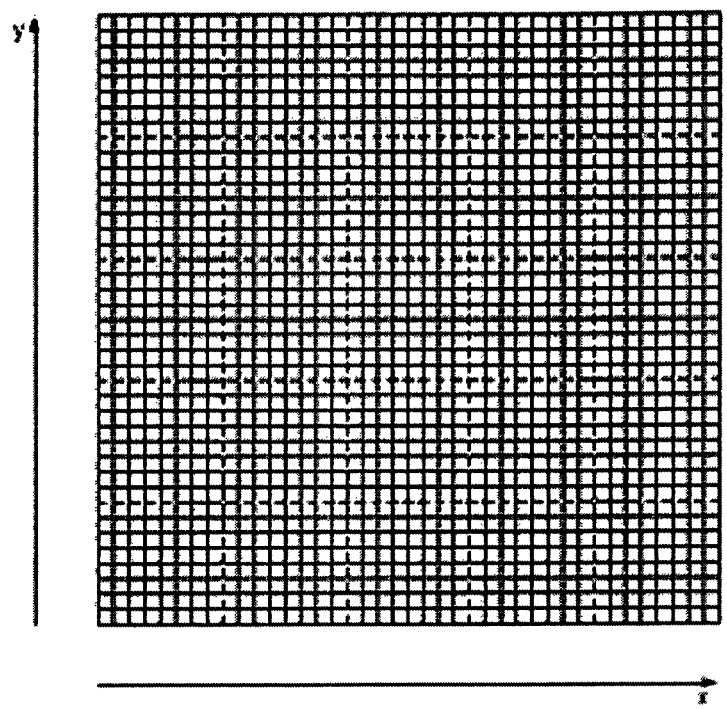
FIG. 2A is shows an exemplary base grid to be projected onto the dynamic array to facilitate definition of the restricted topology, in accordance with one embodiment of the present invention.

FIG. 2A is an illustration showing an exemplary base grid to be projected onto the dynamic array to facilitate definition of the restricted topology, in accordance with one embodiment of the present invention. The base grid can be used to facilitate parallel placement of the linear-shaped features in each layer of the dynamic array at the appropriate optimized pitch. Although not physically defined as part of the dynamic array, the base grid can be considered as a projection on each layer of the dynamic array. Also, it should be understood that the base grid is projected in a substantially consistent manner with respect to position on each layer of the dynamic array, thus facilitating accurate feature stacking and alignment.

Figure 2B:
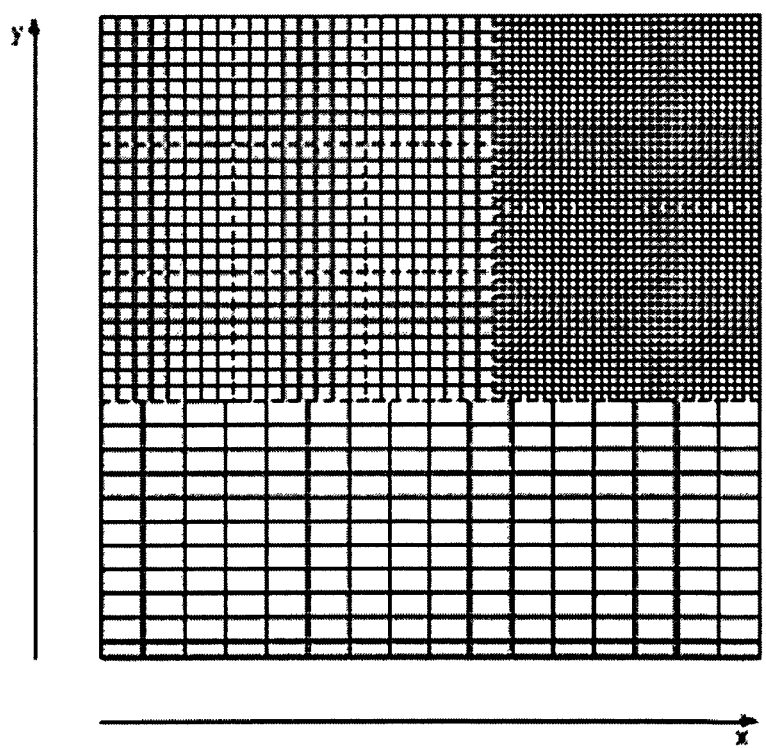
FIG. 2B shows separate base grids projected across separate regions of the die, in accordance with an exemplary embodiment of the present invention.

In the exemplary embodiment of FIG. 2A, the base grid is defined as a rectangular grid, i.e., Cartesian grid, in accordance with a first reference direction (x) and a second reference direction (y). The gridpoint-to-gridpoint spacing in the first and second reference directions can be defined as necessary to enable definition of the linear-shaped features at the optimized feature-to-feature spacing. Also, the gridpoint spacing in the first reference direction (x) can be different than the gridpoint spacing in the second reference direction (y). In one embodiment, a single base grid is projected across the entire die to enable location of the various linear-shaped features in each layer across the entire die. However, in other embodiments, separate base grids can be projected across separate regions of the die to support different feature-to-feature spacing requirements within the separate regions of the die. FIG. 2B is an illustration showing separate base grids projected across separate regions of the die, in accordance with an exemplary embodiment of the present invention.

The layout architecture of the dynamic array follows the base grid pattern. Thus, it is possible to use grid points to represent where changes in direction occur in diffusion, wherein gate electrode and metal linear-shaped features are placed, where contacts are placed, where opens are in the linear-shaped gate electrode and metal features, etc. The pitch of the gridpoints, i.e., the gridpoint-to-gridpoint spacing, should be set for a given feature line width, such that exposure of neighboring linear-shaped features of the given feature line width will reinforce each other, wherein the linear-shaped features are centered on gridpoints. With reference to the dynamic array stack of FIG. 1 and the exemplary base grid of FIG. 2A, in one embodiment, the gridpoint spacing in the first reference direction (x) is set by the required gate electrode pitch. In this same embodiment, the gridpoint pitch in the second reference direction (y) is set by the metal 1 pitch. For example, in a 90 nm logic process technology, the gridpoint pitch in the second reference direction (y) is about 0.24 micron. In one embodiment, metal 1 and metal 2 layers will have a common spacing and pitch. A different spacing and pitch may be used above the metal 2 layer.

The various layers of the dynamic array are defined such that the linear-shaped features in adjacent layers extend in a crosswise manner with respect to each other. For example, the linear-shaped features of adjacent layers may extend orthogonally, i.e., perpendicularly with respect to each other. Also, the linear-shaped features of one layer may extend across the linear-shaped features of an adjacent layer at an angle, e.g., at about 45 degrees. For example, in one embodiment the linear-shaped feature of one layer extend in the first reference direction (x) and the linear-shaped features of the adjacent layer extend diagonally with respect to the first (x) and second (y) reference directions. It should be appreciated that to route a design in the dynamic array having the linear-shaped features positioned in the crosswise manner in adjacent layers, opens can be defined in the linear-shaped features, and contacts and vias can be defined as necessary.

The dynamic array minimizes the use of bends (or substantial changes in direction) in layout shapes to eliminate unpredictable lithographic interactions. Specifically, prior to OPC or other RET processing, the dynamic array allows bends in the diffusion layer to enable control of device sizes, but does not allow substantial bends (or substantial changes in direction) in layers above the diffusion layer.

Figure 3:
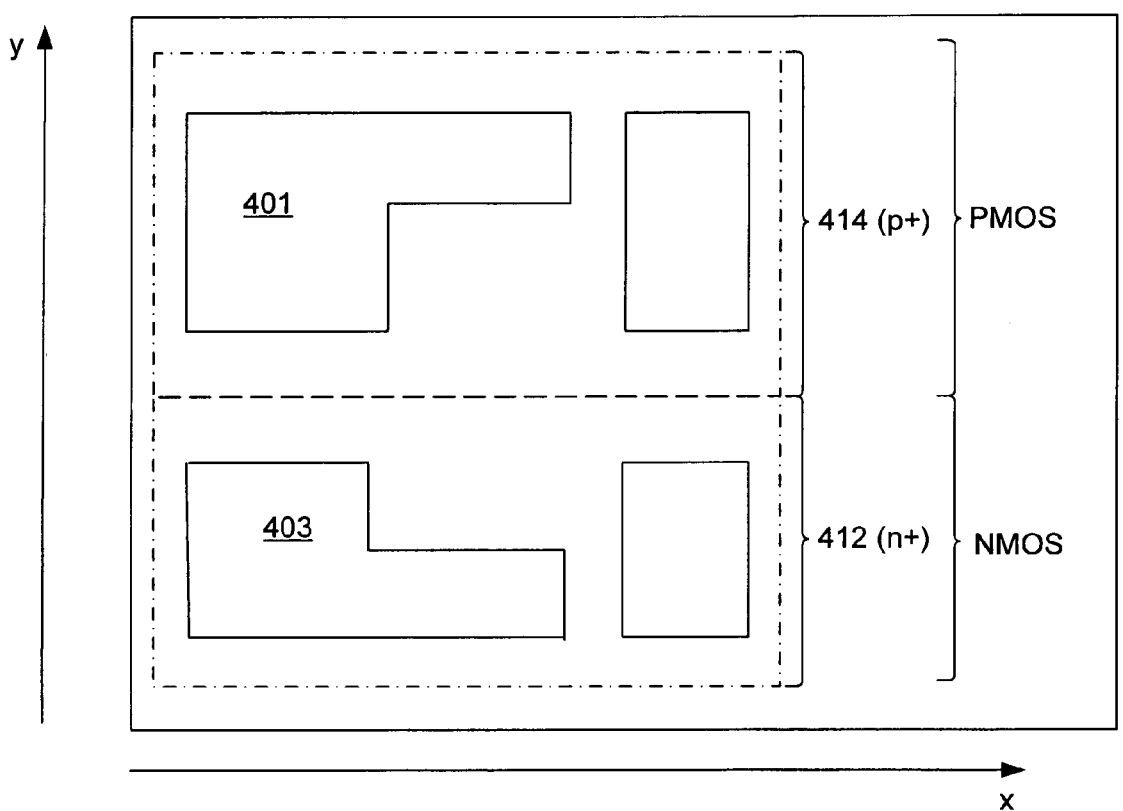
FIG. 3 shows a diffusion layer layout of an exemplary dynamic array, in accordance with one embodiment of the present invention.
Figure 4:
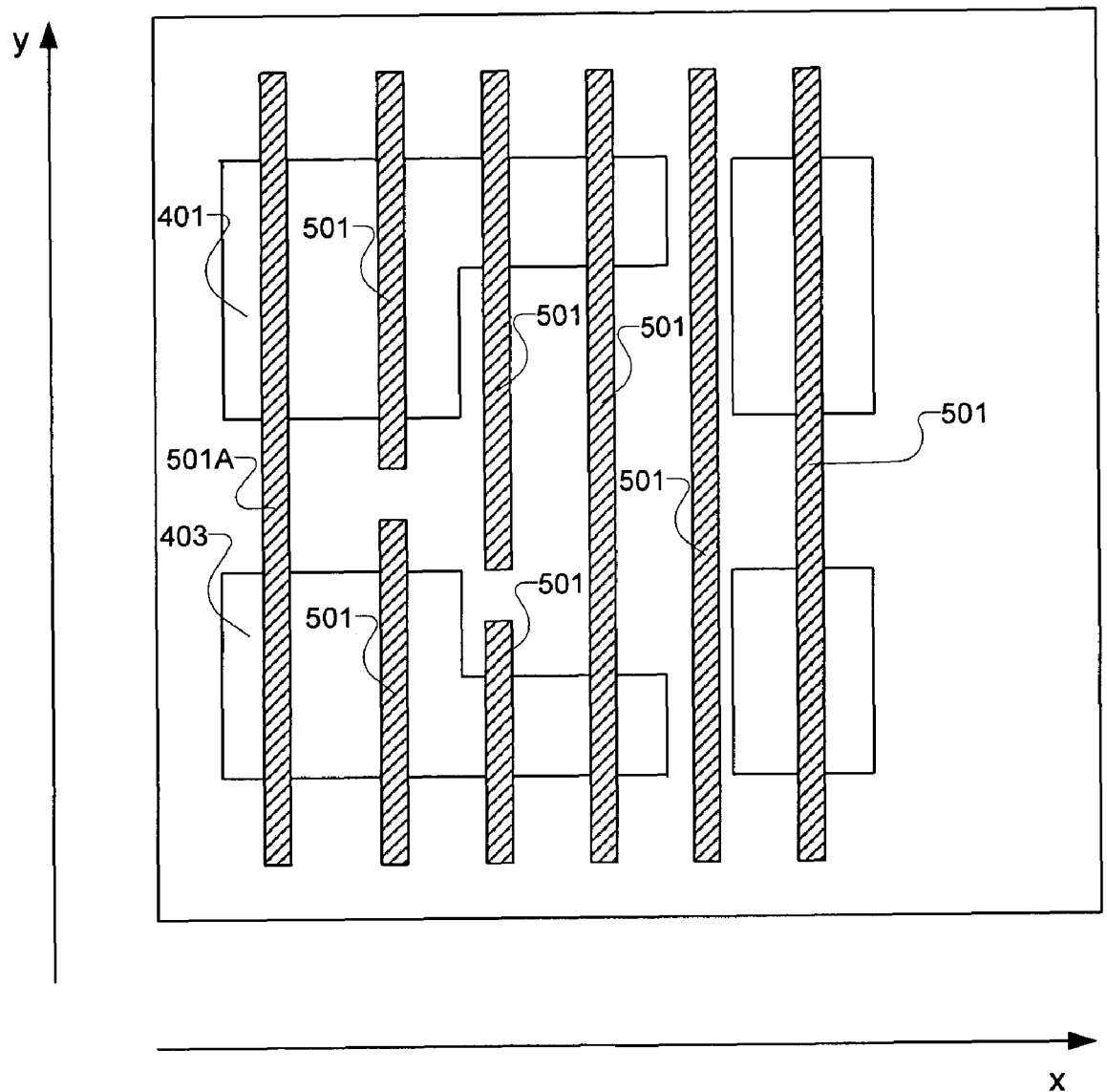
FIG. 4 shows a gate electrode layer and the diffusion layer of FIG. 3, in accordance with one embodiment of the present invention.

An exemplary buildup of dynamic array layers from diffusion through metal 2 are described with respect to FIGS. 3 and 4. It should be appreciated that the dynamic array described with respect to FIGS. 3 through 4 is provided by way of example only, and is not intended to convey limitations of the dynamic array architecture. The dynamic array can be used in accordance with the principles presented herein to define essentially any integrated circuit design, any logic cell, a base cell, an architecture, or design layouts. Designs can be on physical chips, wafers, substrates or drawn on paper, film, or stored in files. If stored in files, the files can be stored on any computer readable device. The computer readable device can be stored on a local computer, on a networked computer and the files can be transferred, shared or used over the Internet or local network.

FIG. 3 shows a diffusion layer layout of an exemplary dynamic array, in accordance with one embodiment of the present invention. The diffusion layer of FIG. 3 shows a p-diffusion region 401 and an n-diffusion region 403. While the diffusion regions are defined according to the underlying base grid, the diffusion regions are not subject to the linear-shaped feature restrictions associated with the layers above the diffusion layer. However, it is noted that the implant layouts are simpler than in prior art designs, which would otherwise require more shape extension and bends. As shown, n+ implant regions (412) and p+ implant regions (414) are defined as rectangles on the (x), (y) grid with no extraneous jogs or notches. This style permits use of larger implant regions, reduces need for OPC/RET, and enables use of lower resolution and lower cost lithographic systems, e.g., i-line illumination at 365 nm.

FIG. 4 is an illustration showing a gate electrode layer above and adjacent to the diffusion layer of FIG. 3, in accordance with one embodiment of the present invention. As those skilled in the CMOS art will appreciate, the gate electrode features 501 define the transistor gates. The gate electrode features 501 are defined as linear shaped features extending in a parallel relationship across the dynamic array in the second reference direction (y). In one embodiment, the gate electrode features 501 are defined to have a common width. However, in another embodiment, one or more of the gate electrode features can be defined to have a different width. The pitch (center-to-center spacing) of the gate electrode features 501 is minimized while ensuring optimization of lithographic reinforcement, i.e., resonant imaging, provided by neighboring gate electrode features 501. For discussion purposes, gate electrode features 501 extending across the dynamic array in a given line are referred to as a gate electrode track.

The gate electrode features 501 form n-channel and p-channel transistors as they cross the diffusion regions 403 and 401, respectively. Optimal gate electrode feature 501 printing is achieved by drawing gate electrode features 501 at every grid location, even though no diffusion region may be present at some grid locations. Also, long continuous gate electrode features 501 tend to improve line end shortening effects at the ends of gate electrode features within the interior of the dynamic array. Additionally, gate electrode printing is significantly improved when substantially all bends are removed from the gate electrode features 501.

Each of the gate electrode tracks may be interrupted, i.e., broken, any number of times in linearly traversing across the dynamic array in order to provide required electrical connectivity for a particular logic function to be implemented. When a given gate electrode track is required to be interrupted, the separation between ends of the gate electrode track segments at the point of interruption is minimized to the extent possible taking into consideration the manufacturing capability and electrical effects. In one embodiment, optimal manufacturability is achieved when a common end-to-end spacing is used between features within a particular layer.

II. Logic Cell Design Using Self-Aligned Local Interconnects on Canvas

Figure 5A:
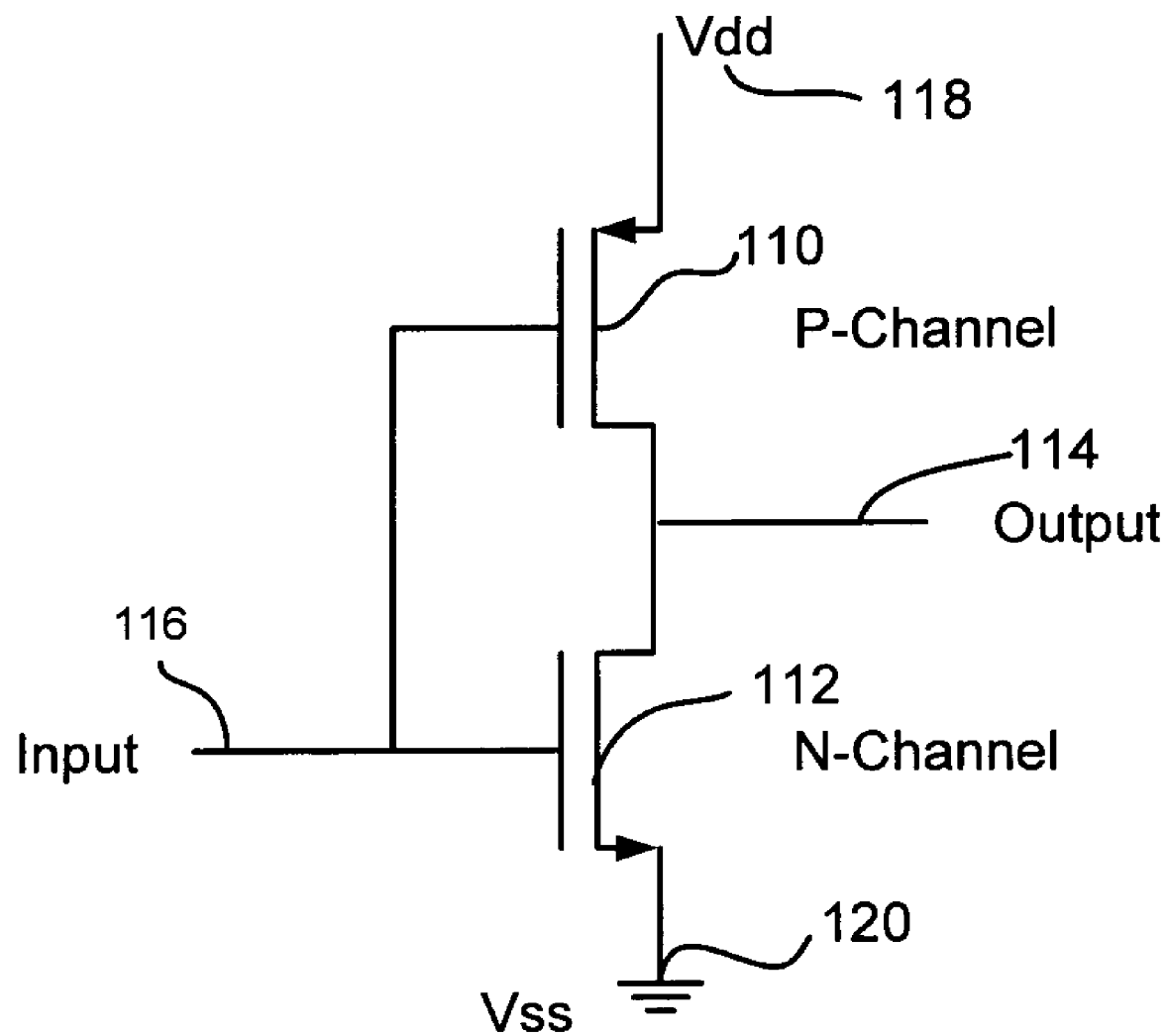
FIG. 5A illustrates a circuit representation of a logic inverter using a PMOS and an NMOS transistor, in accordance with one embodiment of the present invention.

FIG. 5A illustrates a circuit representation of the exemplary logic inverter. However, as noted above, the logic inerter is only being shown and discussed to convey the process of making the self-aligned local interconnects, which can be implemented any other primitive, cell, logic device, or process methodology. As shown, the PMOS transistor 110 and the NMOS transistor 112 are coupled to make a logic inverter. The source of the PMOS transistor 110 is connected to Vdd 118 and the drain of the PMOS transistor 112 is connected to the drain of the NMOS transistor 112. The source of the NMOS transistor 112 is connected to the ground (Vss) 120. A common input 116 is provided to the transistors and the output 114 is provided at the connection of the drain of the PMOS transistor 110 and the drain of the NMOS transistor 112. Again, the inverter logic is used as an example to provide an understanding of the embodiments of the present invention. A person skilled in the art, however, would appreciate that the embodiments may also be employed in the fabrication of any other types of logic cells, devices, and integrated circuits.

Figure 5B:
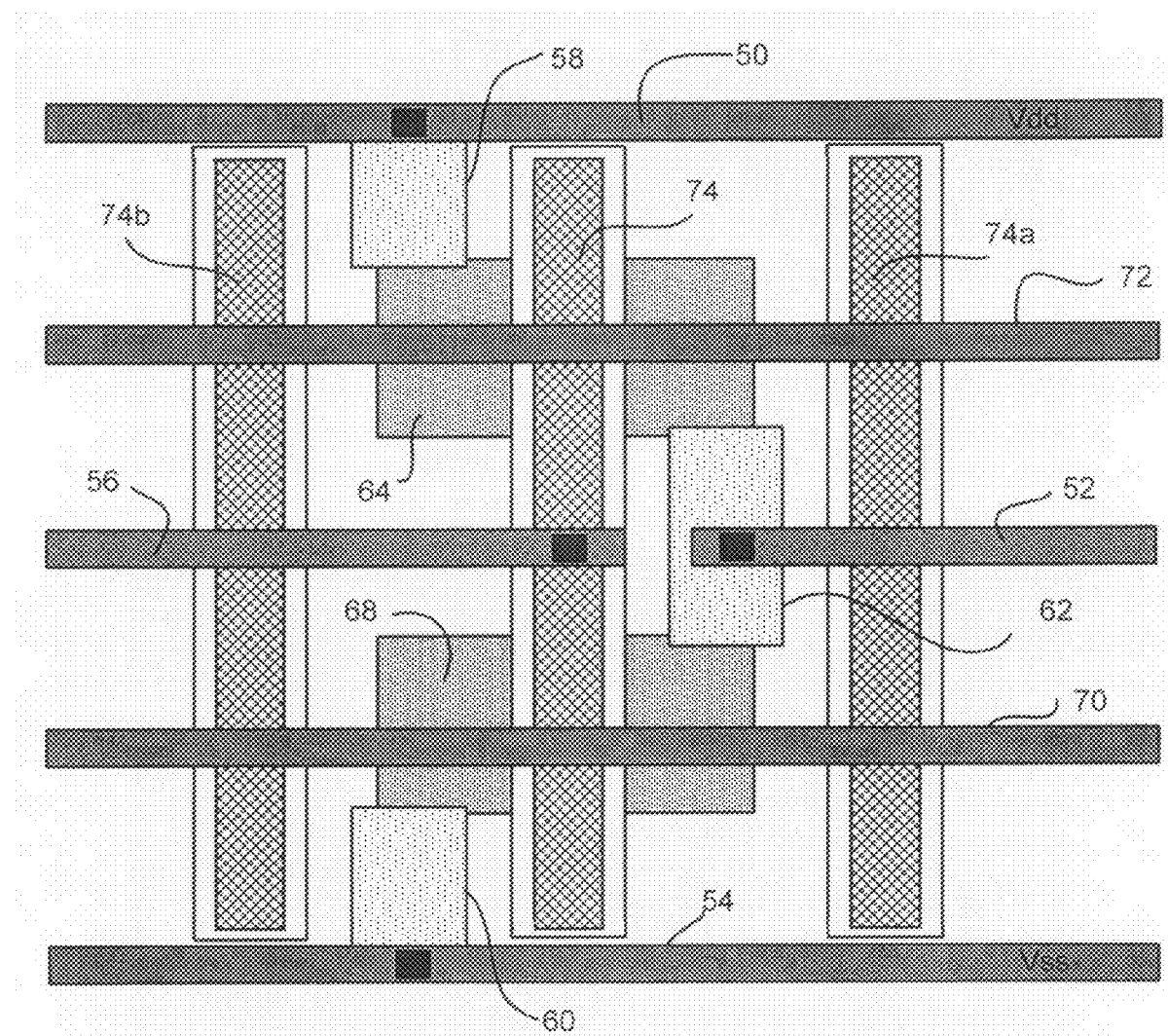
FIG. 5B illustrates a plan view of an exemplary logic inverter to demonstrate a use of the self-aligned local interconnects, in accordance with one embodiment of the present invention.

FIG. 5B illustrates a plan view of an exemplary logic inverter having self-aligned local interconnects 58/60 to connect P 64 and N 68 diffusion regions to Vdd 50 and Vss 54, respectively. A self-aligned local interconnect 62 is also being used to connect the drain of the PMOS transistor to the drain of the NMOS transistor. In one embodiment, all self-aligned local interconnects in an integrated circuit run parallel to the gate electrode channels on the substrate. One of many advantages of laying the local interconnects in one direction is that the local interconnect layer can replace one metal layer that would otherwise be needed to make the connections that are being made using the self-aligned local interconnects. Metal 1 lines 50, 72, 70, and 54 are aligned in one direction that is perpendicular to the gate electrode line 74. The alignment of metal lines can be different in other embodiments.

Still referring to FIG. 5B, there are numerous advantages of employing the self-aligned local interconnects. In one example, the self-aligned local interconnect 58 connecting P diffusion region 64 to Vdd line 50 eliminates the need of fabricating an L shaped diffusion region extending towards the Vdd line 50. In some designs, the self-aligned local interconnect 58 eliminates the need for a metal strap to connect the diffusion region 64 to the Vdd line 50. Elimination of the metal strap and associated contact increases device performance and reduces device size. Performance is increased because a metal strap connecting to the diffusion regions would require one or more contacts, which interferes with beneficial straining of silicon. Thus, reducing metal contacts to the diffusion regions, unless necessary for some design configurations, will boost device performance.

Figure 6A:
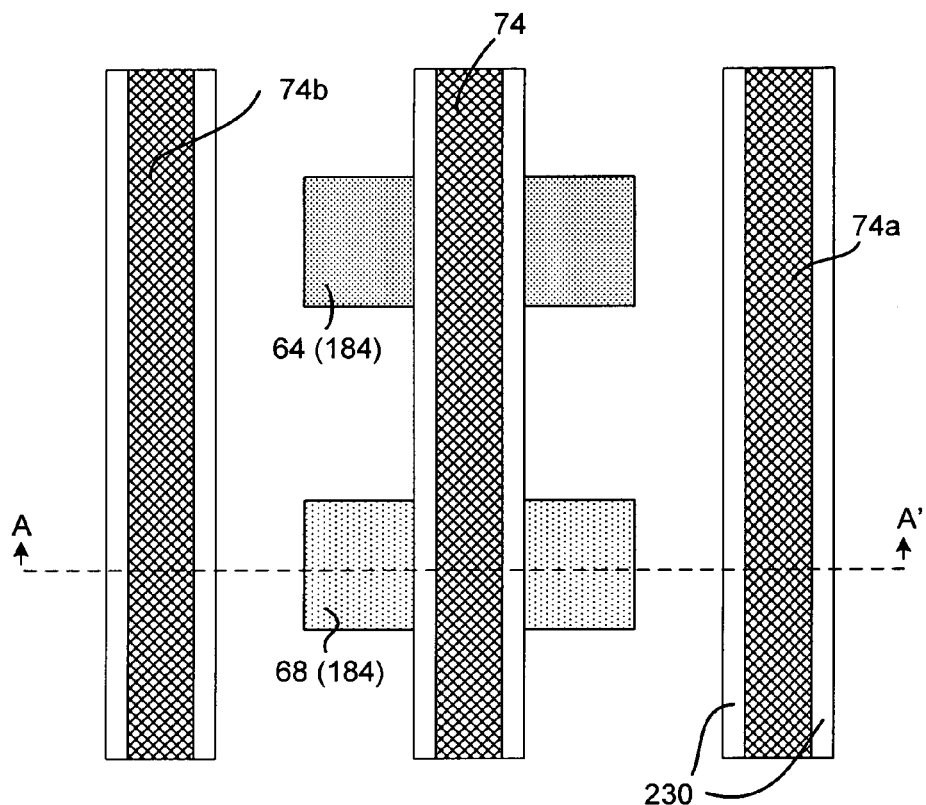
FIG. 6A illustrates a plan view of an exemplary logic inverter showing transistor source/drains, electrodes, and sidewall spacers surrounding the gate electrodes, in accordance with one embodiment of the present invention.

FIG. 6A illustrates a plan view of a partially fabricated integrated circuit showing a P diffusion region 64 and a N diffusion region 68 and a gate electrode line 74 over the P diffusion region 64 and the N diffusion region 68. In this partial view example, the other gate electrode lines 74a, 74b are laid over shallow trench isolation (STI) regions. The gate electrodes 74, 74a, 74b include dielectric spacers (or gate sidewall spacers) on both sides.

Although not shown for ease of discussion, the ends of the gate electrodes may also have dielectric spacers. Since, by design, the gate electrode lines are uniformly placed on the substrates, some of the gate electrode lines are formed over the STI regions. Thus, gates formed over the STI are inactive gates. An active gate is formed when a gate electrode is placed over a diffusion region, and a transistor can be defined. In one embodiment, the partially fabricated integrated circuit is fabricated using a standard CMOS fabrication process.

Figure 6B:
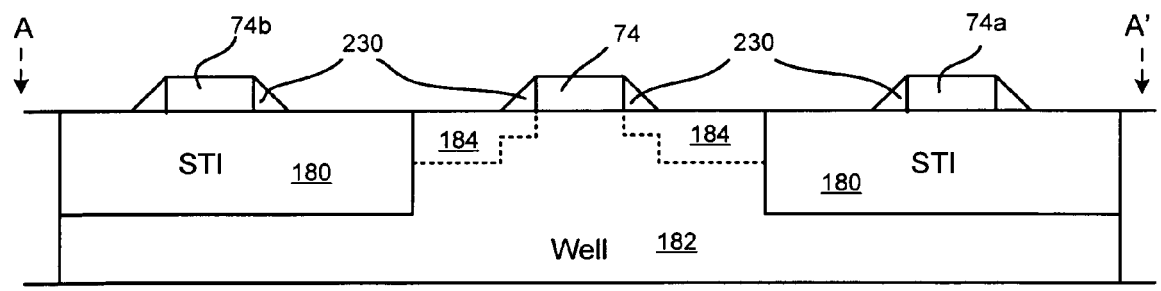
FIG. 6B illustrates a cross-section view of cutline A-A' of the exemplary logic inverter of FIG. 6A showing a transistor well, transistor source/drains, gate electrodes, sidewall spacers, and STI regions, in accordance with one embodiment of the present invention.

FIG. 6B illustrates a cross-section of a partially fabricated integrated circuit of FIG. 6A. It should be understood that the figures are not meant to provide an exact representation of dimensions or exact relative dimensions. On the other hand, the figures should be understood to generally convey the placement of features, layers and the example sequence of processing. Additionally, it should be understood that some sequence steps are not pictorially illustrated, as they are known to those skilled in the art, and not important to the process and sequence flows illustrated herein.

With this in mind, the partially fabricated integrated circuit, is formed over a silicon wafer, and includes a well 182 and shallow trench isolation (STI) regions 180, to provide isolation between adjacent active devices in the integrated circuit. The well 182 includes diffusion regions 184 and a gate electrode 74. The gate electrodes include dielectric spacers (also known as sidewall spacers) 230 formed along the sides of the gate electrode lines. As discussed above, to optimize the design, the gate electrodes (or lines) are fabricated in a parallel orientation, relative to each other. As described herein, therefore, "channels" are defined between the respective gate electrodes. The spacing between two adjacent gate electrode channels is therefore dictated by the regular spacing of the gate electrode lines. As will be discussed in more detail below, the resulting self-aligned local interconnects will reside in the channels between adjacent gate electrodes (or beside a gate electrode if no neighboring gate electrode is present). Because they will predominantly remain in the channels, the self-aligned local interconnects will be self-aligning.

Figure 7A:
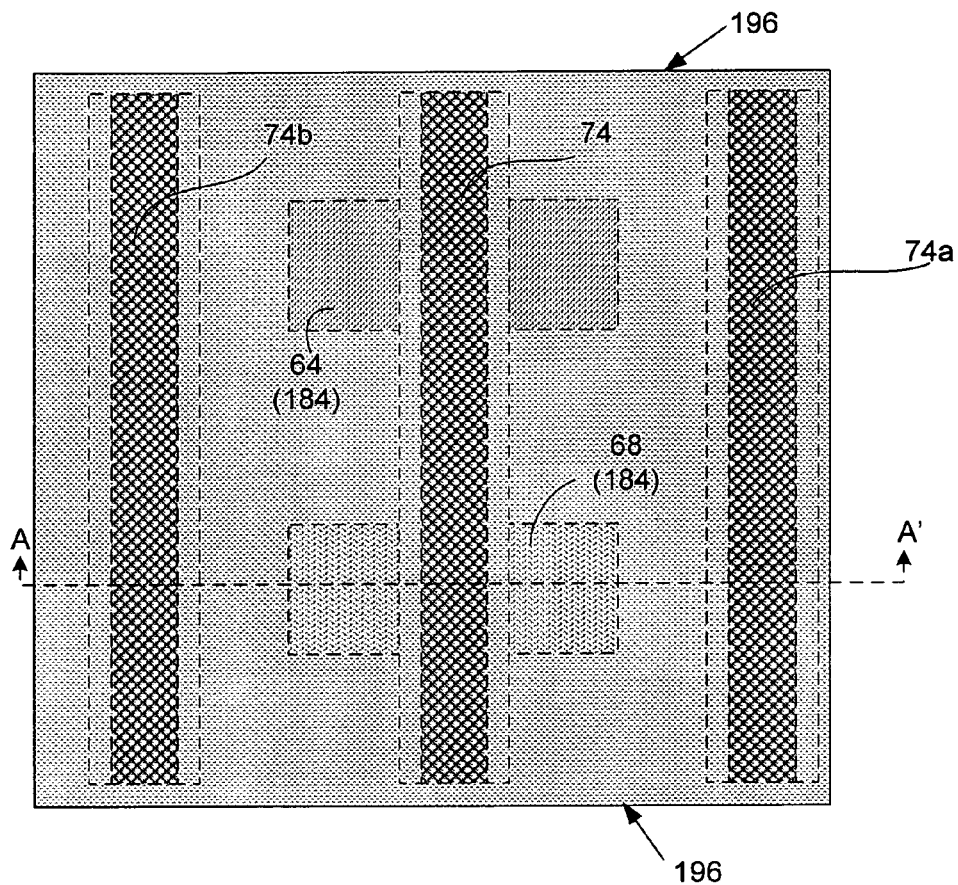
FIG. 7A shows a section of an exemplary logic inverter with a local interconnect layer covering the underlying elements shown in FIG. 6A, in accordance with one embodiment of the present invention.
Figure 7B:
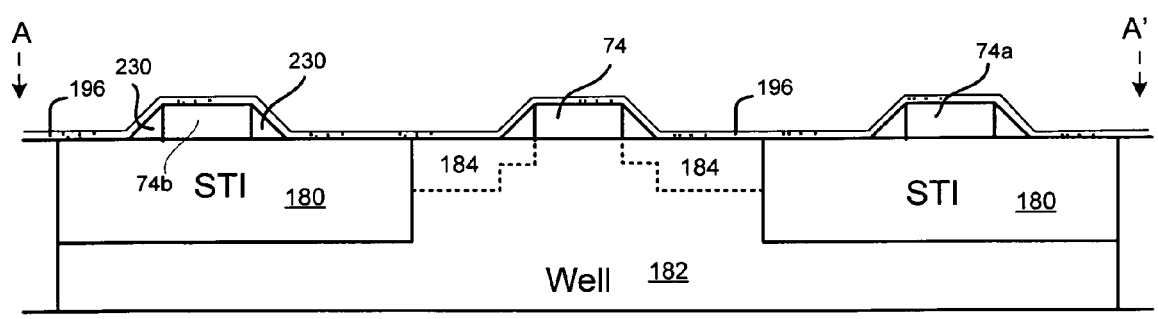
FIG. 7B is a cross-section view of a section of an exemplary logic inverter with a local interconnect layer covering the underlying elements shown in FIG. 6B, in accordance with one embodiment of the present invention.

In FIGS. 7A and 7B, a local interconnect layer 196 is formed over the diffusion regions 184, the gate electrodes 74, 74a, 74b, and the spacers. By way of example, formation of the local interconnect layer 196 can be through a metal deposition process. For ease of visualizing, the local interconnect layer 196 is shown in FIG. 7A as a semi-transparent layer. The cross-section of FIG. 7B shows the local interconnect layer 196 deposited over the features of FIG. 6B.

In one embodiment, the local interconnect layer 196 is generally metallic. In a more specific embodiment, the metal may be predominantly nickel (Ni). In other embodiments, the metal can be titanium, platinum, or cobalt. In yet another embodiment, a combination of nickel and platinum can be used. Preferably, the purity of the metal used in the local interconnect layer should comply with the industry standard metals. In one embodiment, the local interconnect layer is deposited using physical vapor deposition (PVD) technique. In other embodiments, the deposition of the local interconnect layer may be done through chemical vapor deposition (CVD) or atomic layer deposition (ALD).

After depositing the interconnect layer 196, the metal of the interconnect layer is reacted with the underlying silicon and if present in the gate electrode, polysilicon. In one example, the reaction is facilitated through a thermal processing step. The reaction can be carried out under a number of process conditions, but as an example, the temperature can be in a range of between about 200 to 400 degree Celsius, and run for a time in a range of about 5 to about 60 seconds for a nickel layer; higher temperatures may be used for other metals. In another example, the temperature can be set to about 300 degrees Celsius, and processed for about 30 seconds. The reaction step is generally performed in a chamber that uses nitrogen or other inert gases.

Figure 8A:
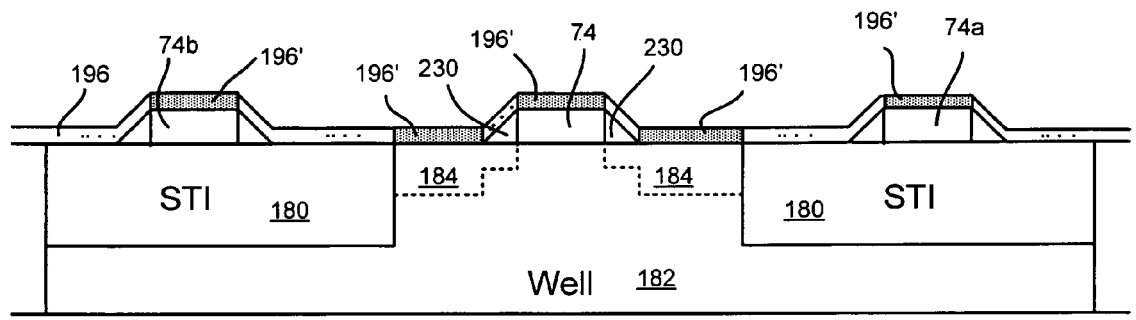
FIG. 8A illustrates formation of silicide through annealing of the local interconnect layer, in accordance with one embodiment of the present invention.

As shown in FIG. 8A, as a result of the reaction process, silicide 196' is formed over the exposed silicon areas. Thus, the silicidation (i.e. formation of silicide 196') occurs over the exposed silicon substrate portion and exposed polysilicon gate if present. As is known, silicide 196' provides good conduction even if the layer is thin. Portions of the local interconnect layer 196 metal not touching silicon will, of course, remain as a metal after the reaction process. In the drawings, FIG. 8A shows the silicide 196' as shaded, in contrast to the metal of the local interconnect layer 196 which did not react.

Figure 8B:
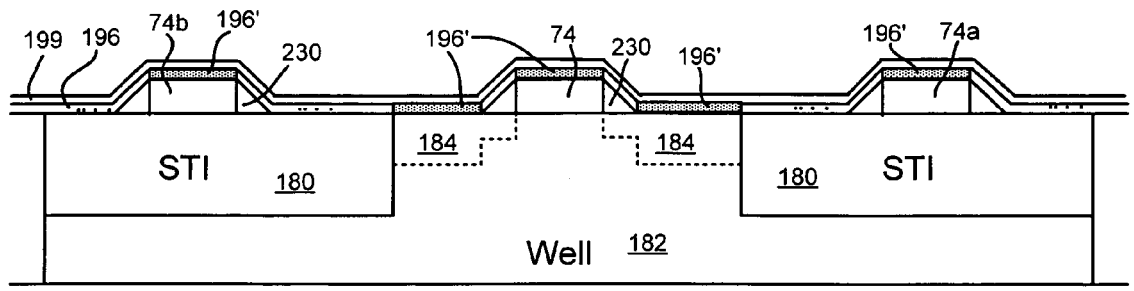
FIG. 8B illustrates depositing a hard mask layer on top of the local interconnect layer over the substrate, in accordance with one embodiment of the present invention.

FIG. 8B illustrates the result after a hard mask layer 199 is deposited over the local interconnect layer 196. In one embodiment, the hard mask layer 199 is an oxide (e.g., $SiO_2$, etc.). In another embodiment, the hard mask layer 199 is a nitride (e.g., silicon nitride, etc.). In yet another embodiment, the hard mask layer 199 is an amorphous carbon (APF). The hard mask layer 199 can be formed in a number of ways, and one such exemplary way is by employing one of a CVD, ALD, or PECVD process. The hard mask layer 199, in this embodiment, is used to protect the local interconnect layer 196 during subsequent removal steps, which remove portions of the local interconnect layer 196 where no conductive connection is needed.

Figure 9A:
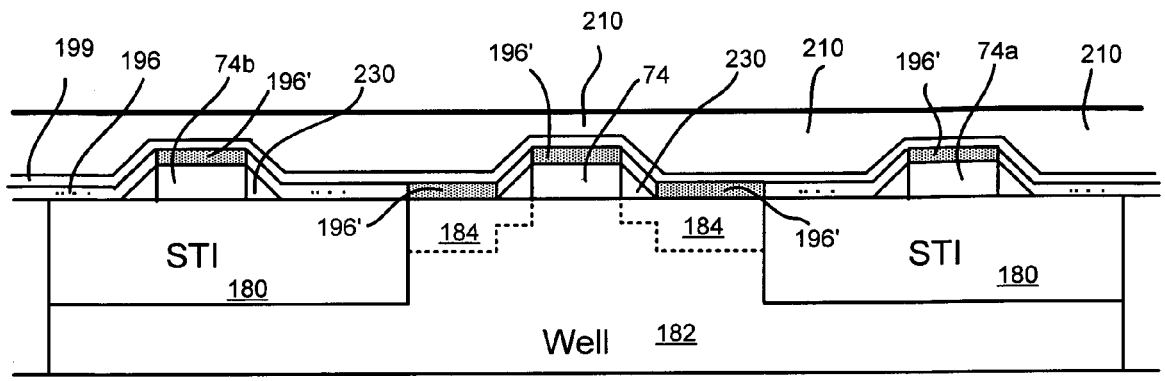
FIG. 9A illustrates a polymer layer covering the elements of FIG. 8B, in accordance with one embodiment of the present invention.
Figure 9B:
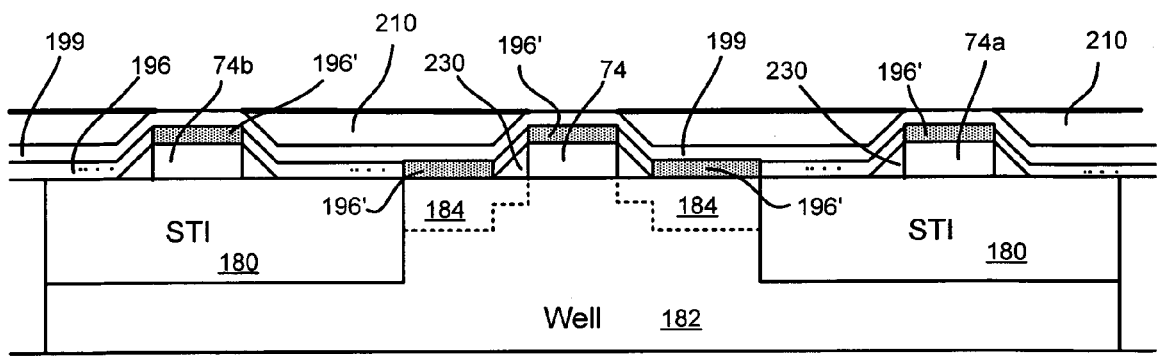
FIG. 9B illustrates a cross section view of the substrate in which the polymer layer is partially removed through plasma etch, in accordance with one embodiment of the present invention.
Figure 9C:
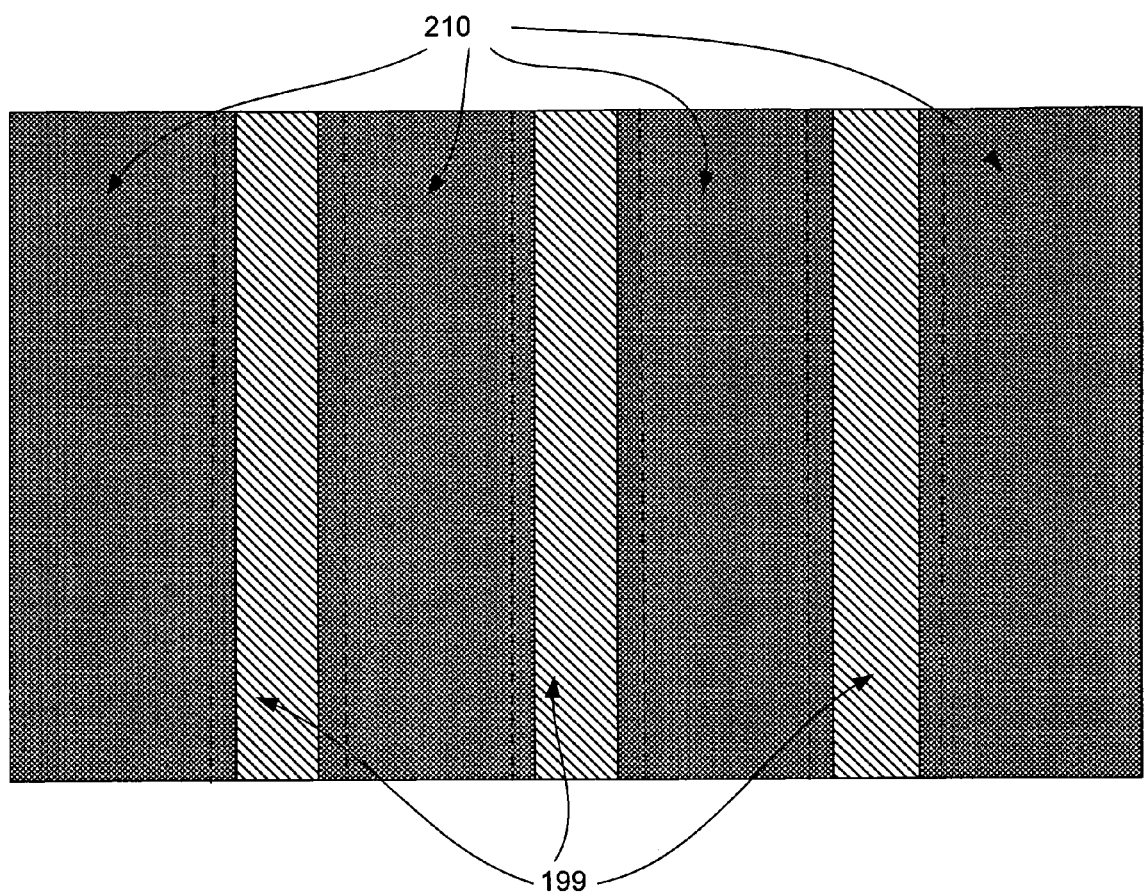
FIG. 9C illustrates a plan view of the substrate in which the polymer layer is etched back to approximately the top of the gate electrodes, in accordance with one embodiment of the present invention.

FIG. 9A shows the cross-section of FIG. 8B after a polymer layer 210 is formed over the hard mask layer 199, in accordance with one embodiment of the present invention. The polymer layer 210 can be applied in a number of ways know in the art. In one example, the polymer layer 210 is preferably spin coated over the surface of the hard mask layer 199. In another embodiment, the polymer layer 210 can be photoresist material, either positive or negative, depending on the desired development process. Other types of photoresist can include, for example, unsensitized photoresists, polymethyl methacrylate resists (PMMA), etc. Once applied, the polymer layer 210 is partially and evenly removed until the hard mask layer 199 is exposed, as shown in FIG. 9B. The removal is preferably performed using a plasma etching operation. One example etching process can take place in an oxygen plasma. The etching process, in this step, is preferably anisotropic in nature, so as to achieve a substantially even removal profile down to the first exposed hard mask layer 199. Standard end-point detection techniques may be used to determine when to stop the etch operation illustrated in FIG. 9B. FIG. 9C is a plan view, showing the exposed hard mask layer 199 and the remaining polymer layer 210. At this stage, the gate sidewall spacers (i.e. dielectric spacers) 230 are also still covered by the polymer layer 210.

It should be noted that another advantage of placing the gate electrode lines at a uniform regular spacing is that the polymer layer 210 is defined uniformly, having a substantially equal thickness. Without such uniform spacing, the polymer layer 210 could exhibit variations in thickness, which would not be desired. For example, if the thickness of the polymer layer 210 is not substantially uniform over the substrate, some gate electrodes with relatively less polymer material cover may be exposed first, causing possible over etching of the hard mask over certain gates.

Figure 10A:
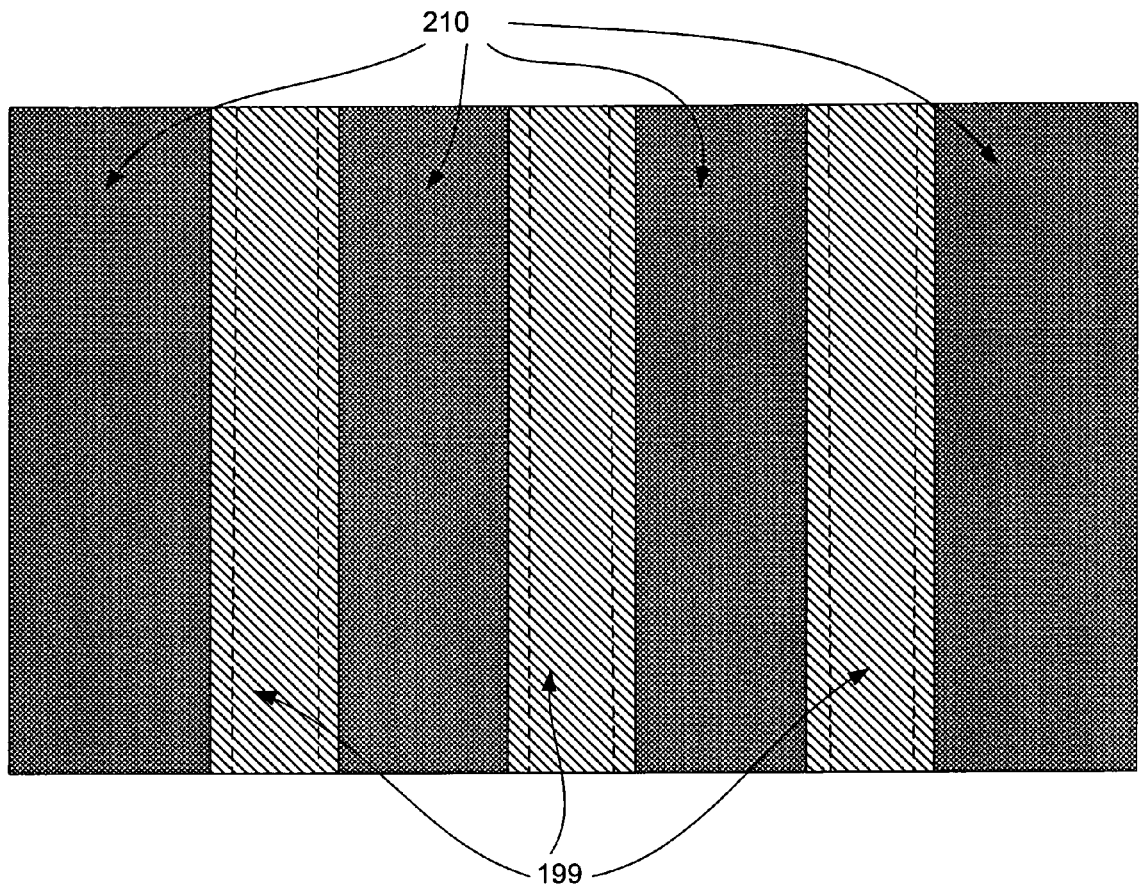
FIG. 10A illustrates a plan view of the exemplary logic inverter after a wet etch to remove the polymer from the dielectric spacers, in accordance with one embodiment of the present invention.
Figure 10B:
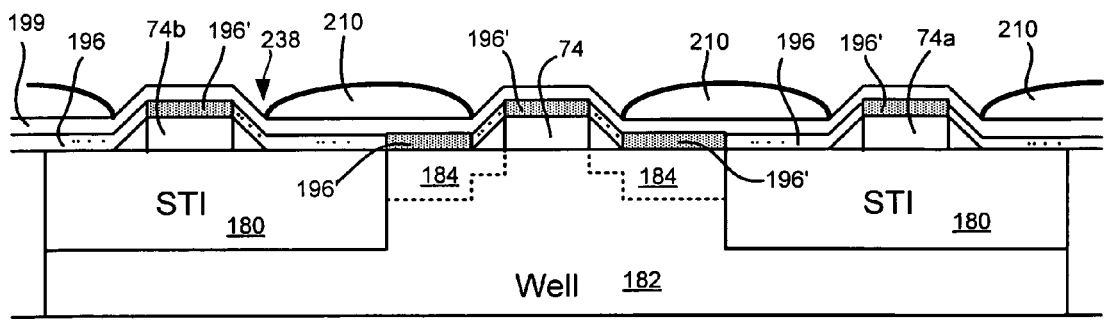
FIG. 10B illustrates a cross-section view of the exemplary logic inverter after removal of the polymer covering the dielectric spacers, in accordance with one embodiment of the present invention.

Once the hard mask layer 199, over the top of the gate electrodes 74, 74a, 74b is exposed, an isotropic etch is performed. The isotropic etching is designed to remove lateral parts 238 of the polymer layer 210, such as the polymer layer 210 on the gate electrode dielectric spacers 230. As illustrated in FIGS. 10A and 10B, after this isotropic etch is complete, the polymer layer 210 should remains in the form of strips between the gate electrodes 74, 74a, 74b, offset and self-aligned to the gate dielectric spacers 230. Thus, the polymer layer 210 will remain everywhere on the substrate except on the gate electrode lines 74, 74a, 74b and the gate dielectric spacers 230.

Figure 11A:
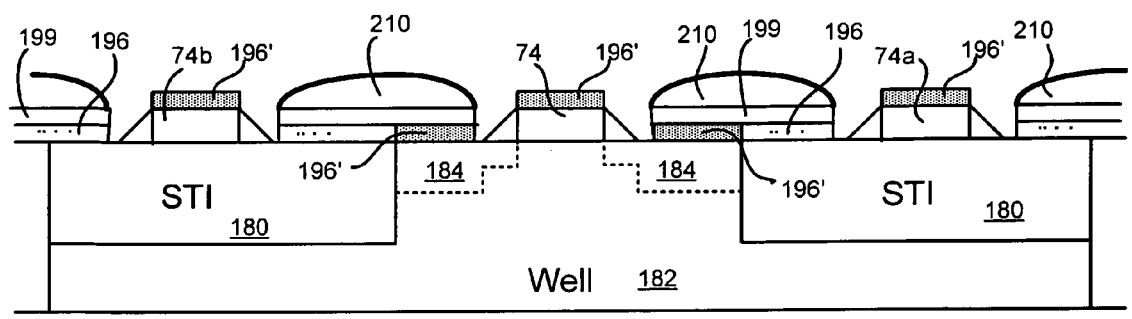
FIG. 11A illustrates a cross section view of the exemplary logic inverter after etching the local interconnect layer and the hard mask layer from the gate electrodes and dielectric spacers, in accordance with one embodiment of the present invention.

FIG. 11A illustrates a cross-section of the substrate after the hard mask layer 199, which is not covered by the polymer layer 210, is removed. Depending on the material of the chosen hard mask, the removal can be performed using a number of known wet or dry etching processes. In one embodiment, once the exposed hard mask layer 199 is removed, the etching can continue so as to remove part of the local interconnect layer 196 material from over the dielectric spacers 230. Removal of this part of the local interconnect layer 196 will provide for a slight separation between the local interconnect layer 196/silicide 196' and the dielectric spacers 230. At this point, the remaining local interconnect layer 196 material, silicide 196' material and hard mask layer 199, as covered by the polymer layer 210, will run in channels between and aligned by the dielectric spacers 230.

Figure 11B:
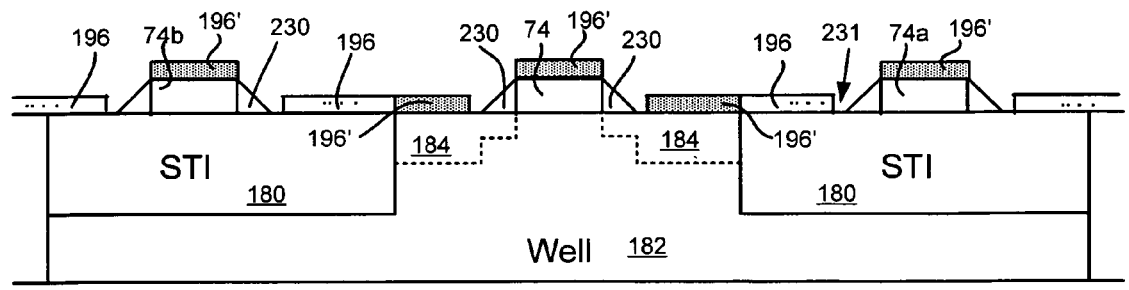
FIG. 11B illustrates a cross section view of the exemplary logic inverter after selective etch of the remaining polymer layer and hard mask layer, in accordance with one embodiment of the present invention.
Figure 12:
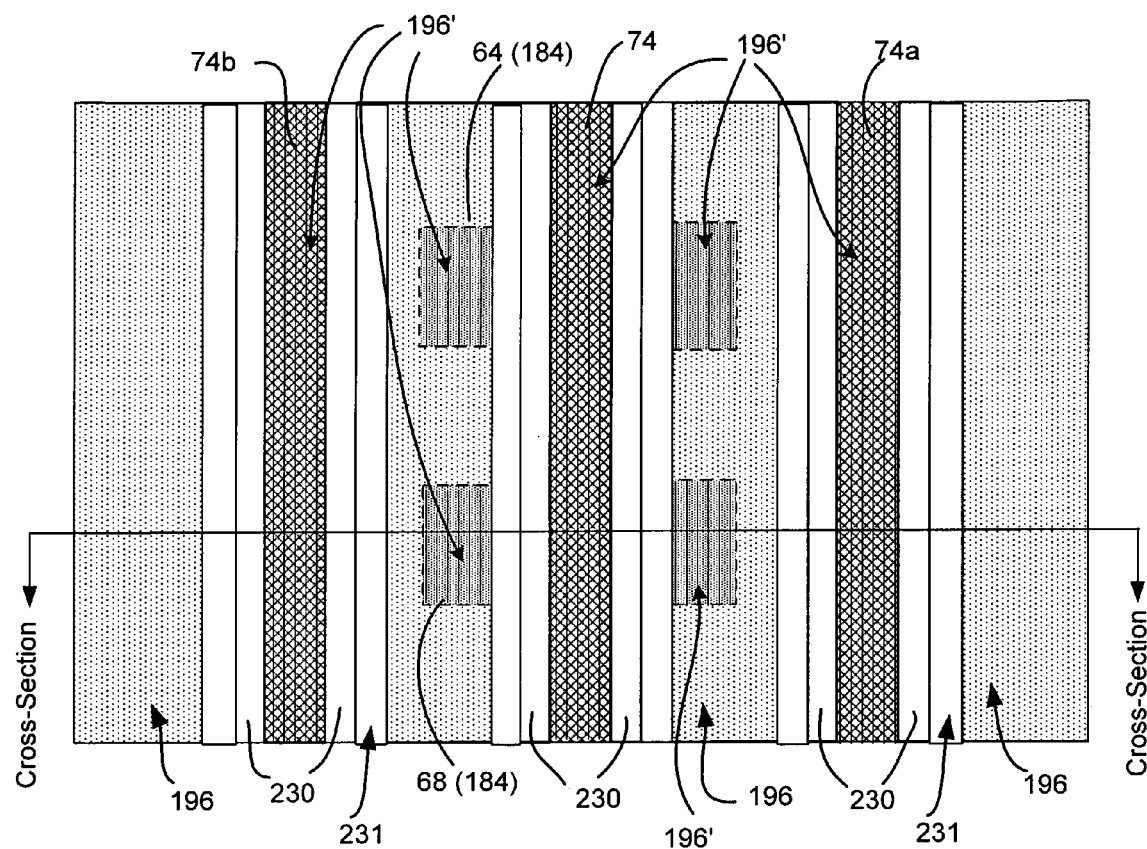
FIG. 12 illustrates a plan view of the exemplary logic inverter after selective etch of the remaining polymer layer and hard mask layer, in accordance with one embodiment of the present invention.

FIG. 11B illustrates a cross-section of the substrate after another selective etching operation is performed to remove the polymer layer 210 and the hard mask layer 199, from above the local interconnect layer 196 (including silicide portions 196'). As can be seen, the local interconnect layer 196 material and the silicide portions 196' will be self-aligned between the dielectric spacers 230. FIG. 12 shows a plan view of substrate in FIG. 11B. As shown, the local interconnect layer 196 runs in the channels between the gate dielectric spacers 230. As noted above, as a result of the etching, the self-aligned local interconnect layer 196 is also spaced a distance 231 apart from dielectric spacers 230. FIG. 12 also illustrates the P 64 and N 68 diffusion regions (both these regions are illustrated in the cross-section illustrations as diffusion region 184).

Figure 13:
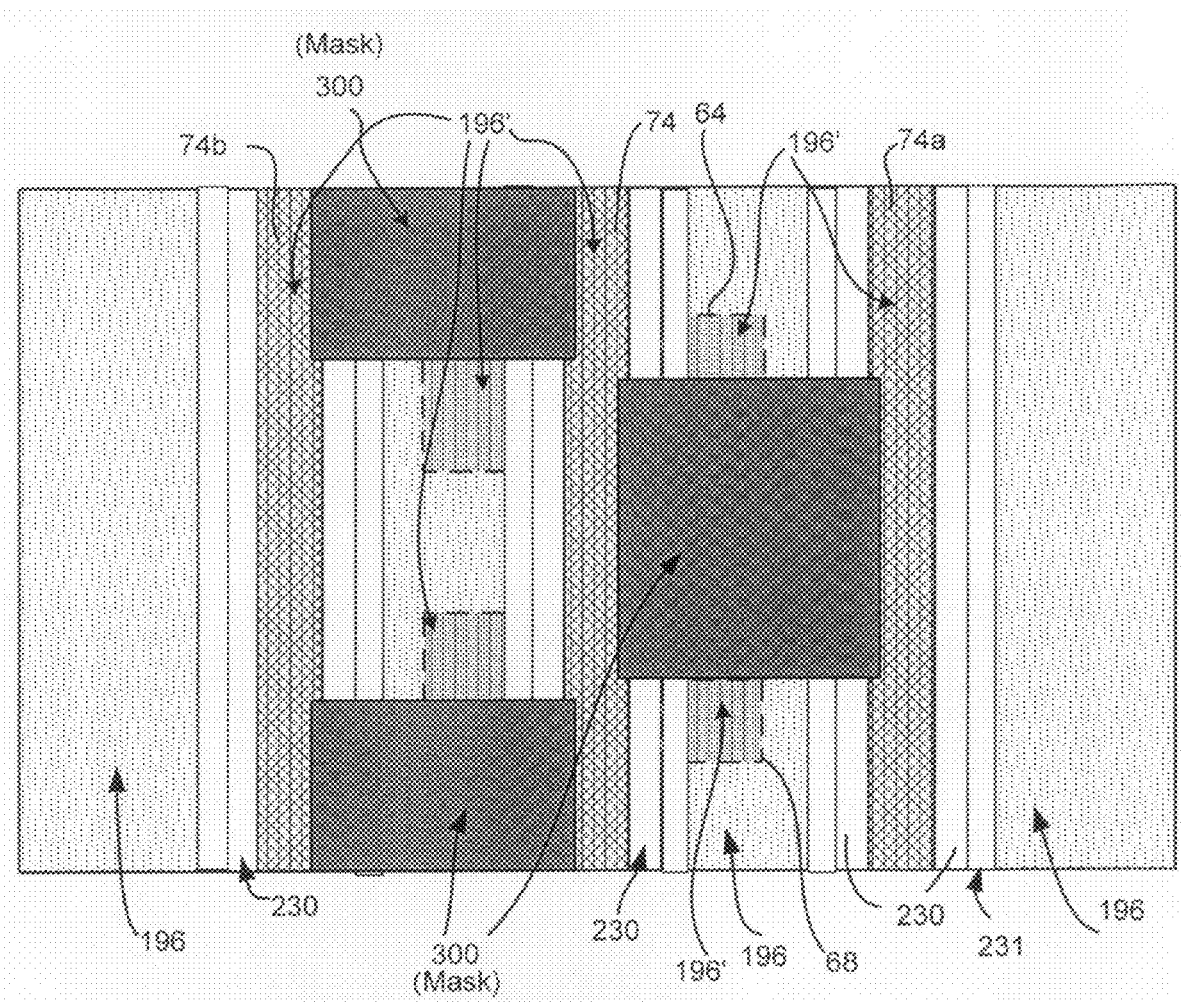
FIG. 13 illustrates a plan view of the exemplary logic inverter after masking portions of the local interconnect layer to protect the local interconnect layer at desired places, in accordance with one embodiment of the present invention.

FIG. 13 illustrates a patterning operation that will facilitate etching, in accordance with one embodiment of the present invention. In one embodiment, a photoresist can be spin coated and then exposed using standard photolithography, to define mask 300. The mask 300, as shown, is defined to cover portions of the local interconnect layer 196 that is to remain after an etching operation is performed. The reacted material that forms the silicide 196', over the exposed silicon or polysilicon if present, will also remain after the etch, even though it is not covered by the mask 300. In one embodiment, the mask 300 can be easily defined without tight layout constraints, as the mask 300 can be defined to loosely lie over the gate electrodes 74, 74a, 74b.

It should be appreciated that tight layout constraints are not needed, as the local interconnect layer 196 material only lies in the channels, and has already been self-aligned between the dielectric spacers 230. Again, the silicide 196' material, will however remain after the etching that is employed to remove the unprotected portions of the local interconnect layer 196. Electrically, the local interconnect layer 196 and the silicide 196' material will define a conductive link or connection or conductive line, similar to a regular interconnect metallization line.

Figure 14:
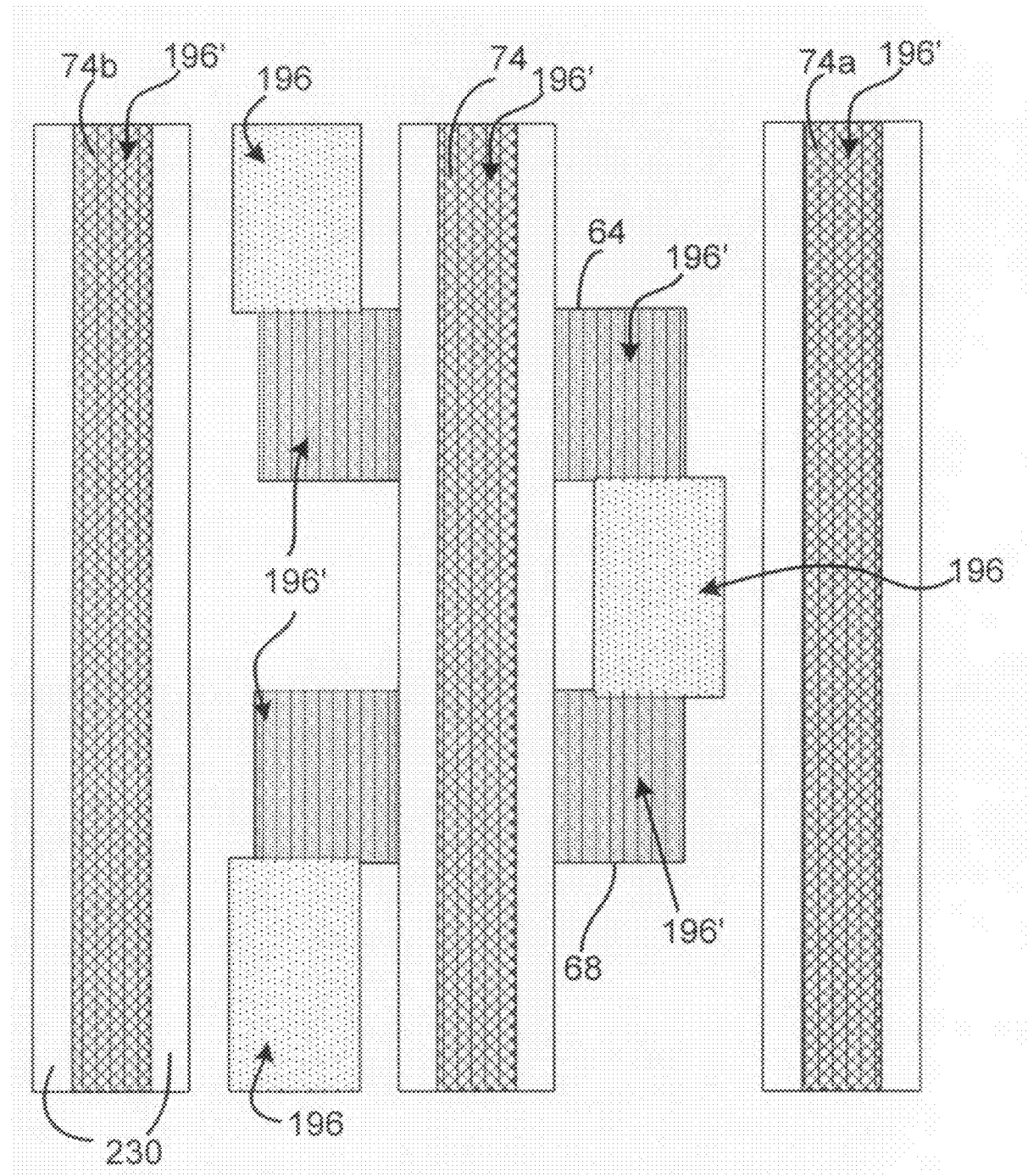
FIG. 14 illustrates a plan view of the exemplary logic inverter showing remaining regions of silicided and non-silicided local interconnect, in accordance with one embodiment of the present invention.

FIG. 14 illustrates a plan view of the substrate after the etching and subsequent removal of the mask 300. As shown, the local interconnect layer 196 will remain in the channels, where the mask 300 protected the material, thus forming true self-aligned local interconnect features. The local interconnect layer 196 that remains, therefore, will functionally complete any interconnection desired within the channel defined between the dielectric spacers 230. After removal of the mask 300, an annealing operation can be performed. The annealing could be, for example, a rapid thermal annealing (RTA) process, that is operated at approximately 450 degrees Celsius, for approximately 30 seconds for nickel.

Figure 15:
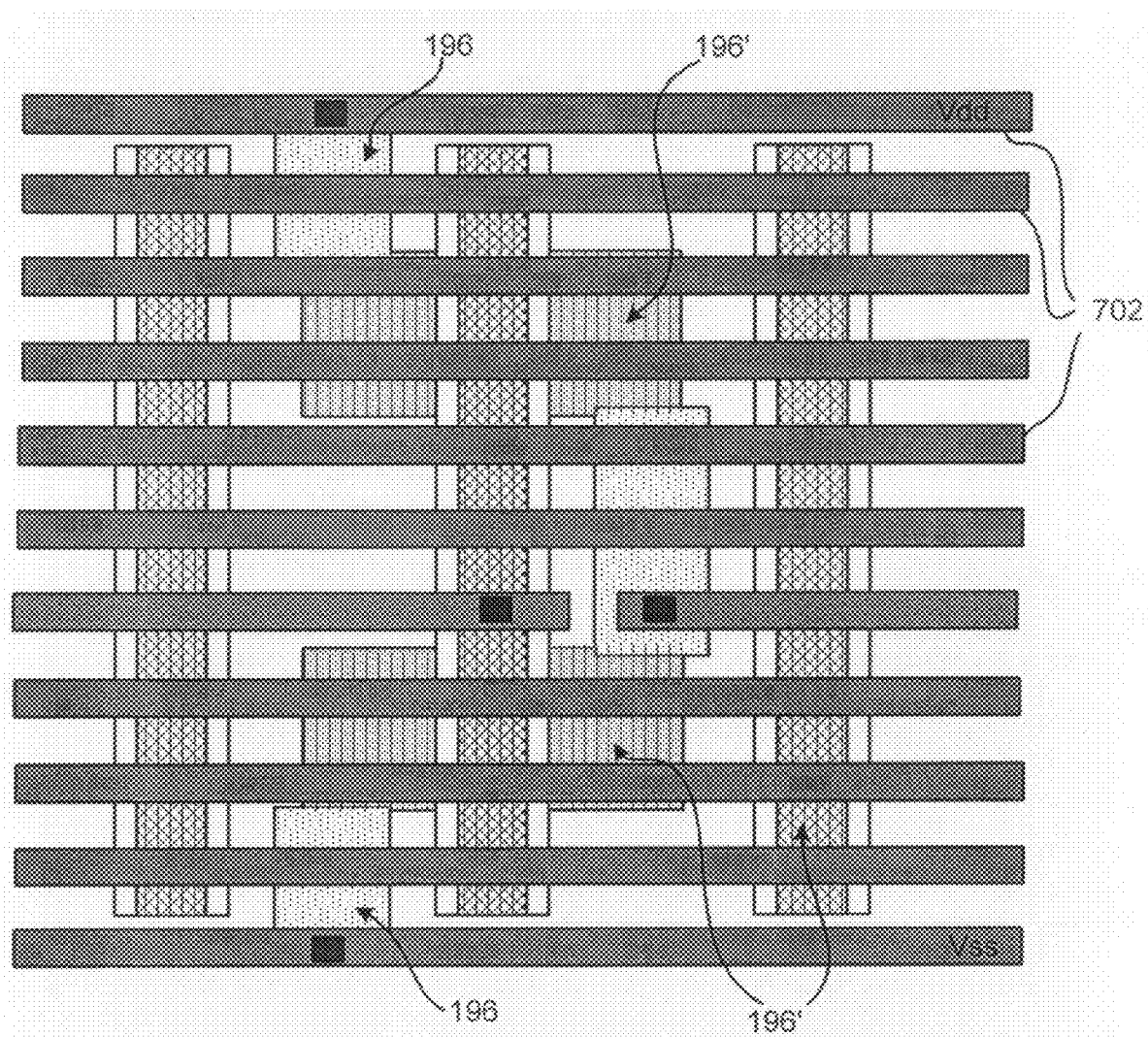
FIG. 15 illustrates a plan view of an exemplary logic inverter as in FIG. 14, with contacts and metal lines added to shown a functional interconnection, in accordance with one embodiment of the present invention.

Referring back to FIG. 5B, metal 1 lines can be fabricated perpendicular to the gate electrode lines 74, 74a, 74b, as shown in FIG. 15. Furthermore, contacts are formed at desired places, to provide electrical conduction between various layers, that is necessary to form the exemplary logic circuit.

In one embodiment, the metal-1 tracks 702 can be fabricated closer to each other, which may enable easier routing and desired connections. Of course, the pitch between lines will depend on the manufacturing capability, the particular circuit, layout, and layout constraints for the type of design and/or circuit. As the self-aligned local interconnects 196 are aligned perpendicular to metal-1 tracks 702, a greater degree of freedom in term of space is available for defining/selecting a contact between the self-aligned local interconnects 196 and selected metal-1 tracks. Therefore, besides the previously discussed advantages of the self-aligned local interconnects, the self-aligned local interconnects also help to provide more freedom in routing metal tracks in levels above, which in turn provide for flexibility in design and fabrication.

Figure 16:
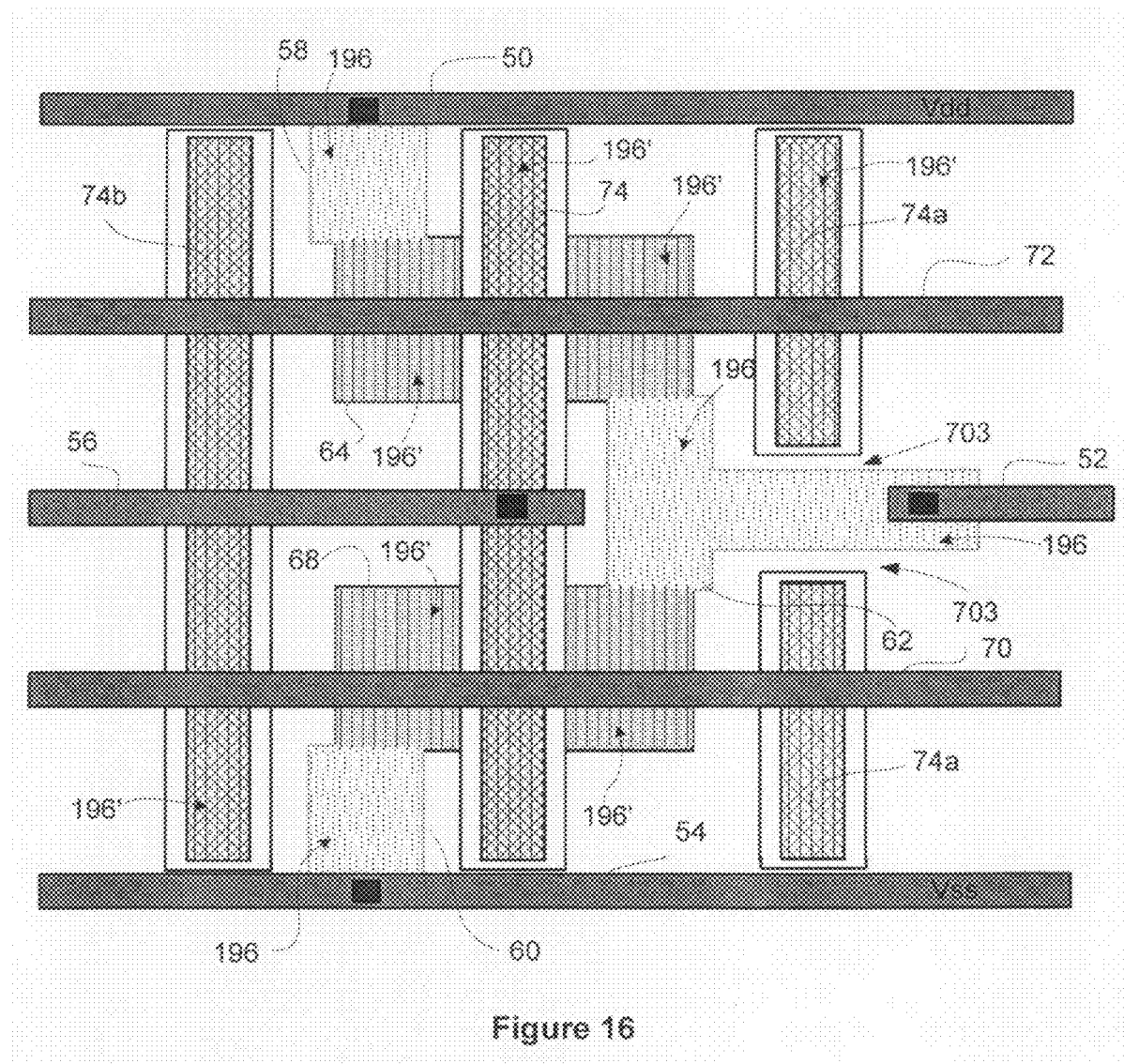
FIG. 16 illustrates a plan view of an exemplary logic inverter showing the self-aligned local interconnect in a gap of a gate line, in accordance with one embodiment of the present invention.

FIG. 16 illustrates an exemplary inverter logic cell, which is fabricated using the self-aligned local interconnects of the present invention. The circuit is similar to the one illustrated in FIG. 5A, except that the gate electrode line 74a is broken into two sections, to provide a gate electrode gap 703. It may be noted that only one gap is shown for the ease of illustration only. In other embodiments, one or more gate electrode lines can have one or more gate electrode gaps. In one embodiment, the gate electrode gap 703 can be used to fabricate the self-aligned local interconnects that are aligned perpendicular to the gate electrode line 74a. The self-aligned local interconnects in these gate electrode gaps 703 can be used to connect two or more devices or two self-aligned local interconnects that are parallel to the gate electrode line 74a. The self-aligned local interconnects in the gate electrode gaps 703 can also ease metal track routing and eliminate the need for some of the metal-1 tracks.

Figure 17A:
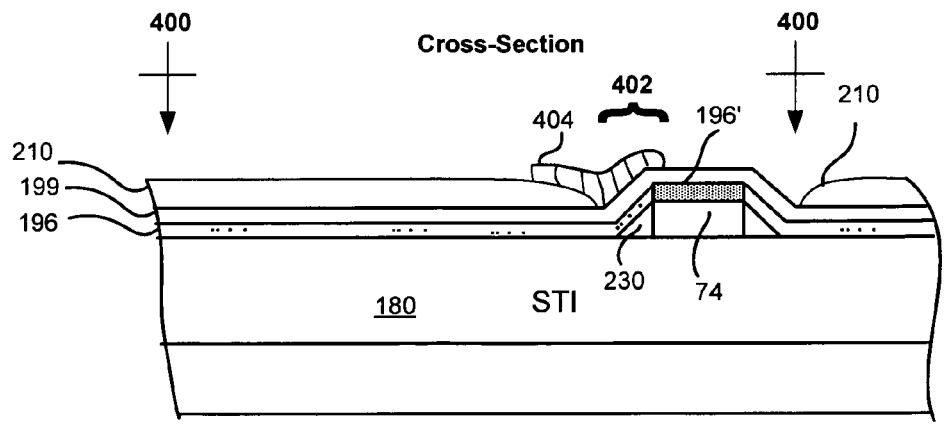
FIGS. 17A-17D illustrate cross-sectional views of an exemplary logic inverter, which uses the local interconnect metal to make connections to a gate, in accordance with one embodiment of the present invention.

FIG. 17A-17D illustrate process operations used to fabricate a connection using the local interconnect layer 196, to make contact to a gate electrode 74, in accordance with another embodiment of the present invention. For ease of understanding, reference is made to a cross-section 400, which is also shown in FIG. 18. FIG. 17A represents a stage in processing that is similar to that described up to FIG. 10B. However, a mask 404 is also formed over a region 402, which lies substantially over the sidewall of the spacer 230 of gate electrode 74. The exact sizing is not particularly important, so long as protection is provided over the material that lies along the spacer 230. This protects the local interconnect material 196 in this region from later etching. The mask 404 can be defined from either hard masks or photoresist masks, depending on the chosen fabrication process.

Figure 17B:
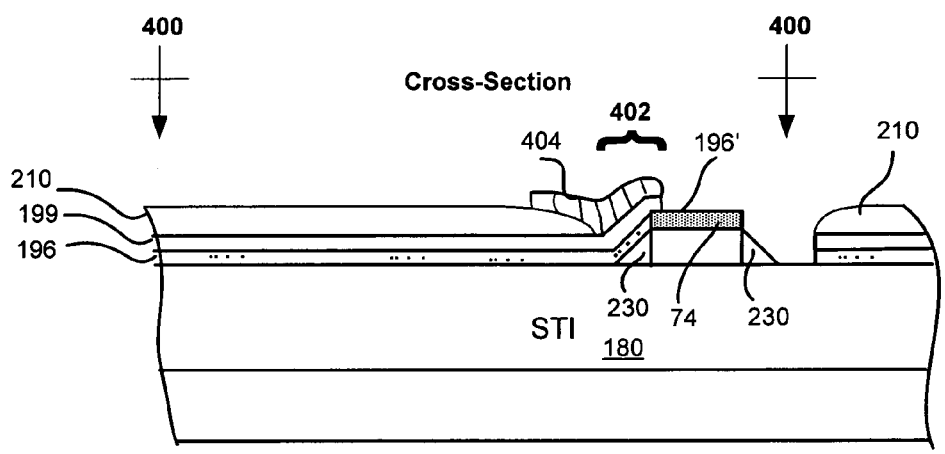
Figure 17C:
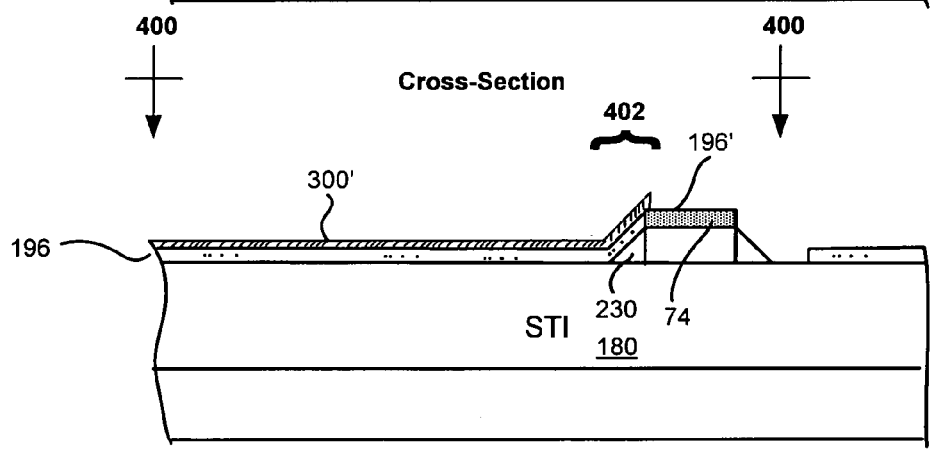
Figure 17D:
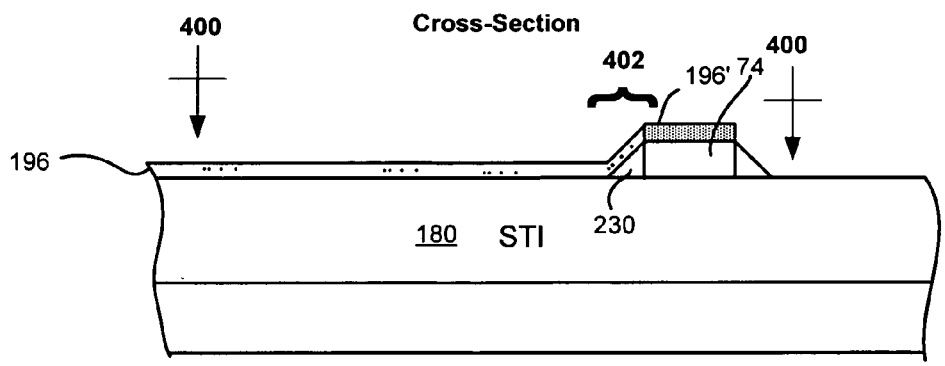
Figure 18:
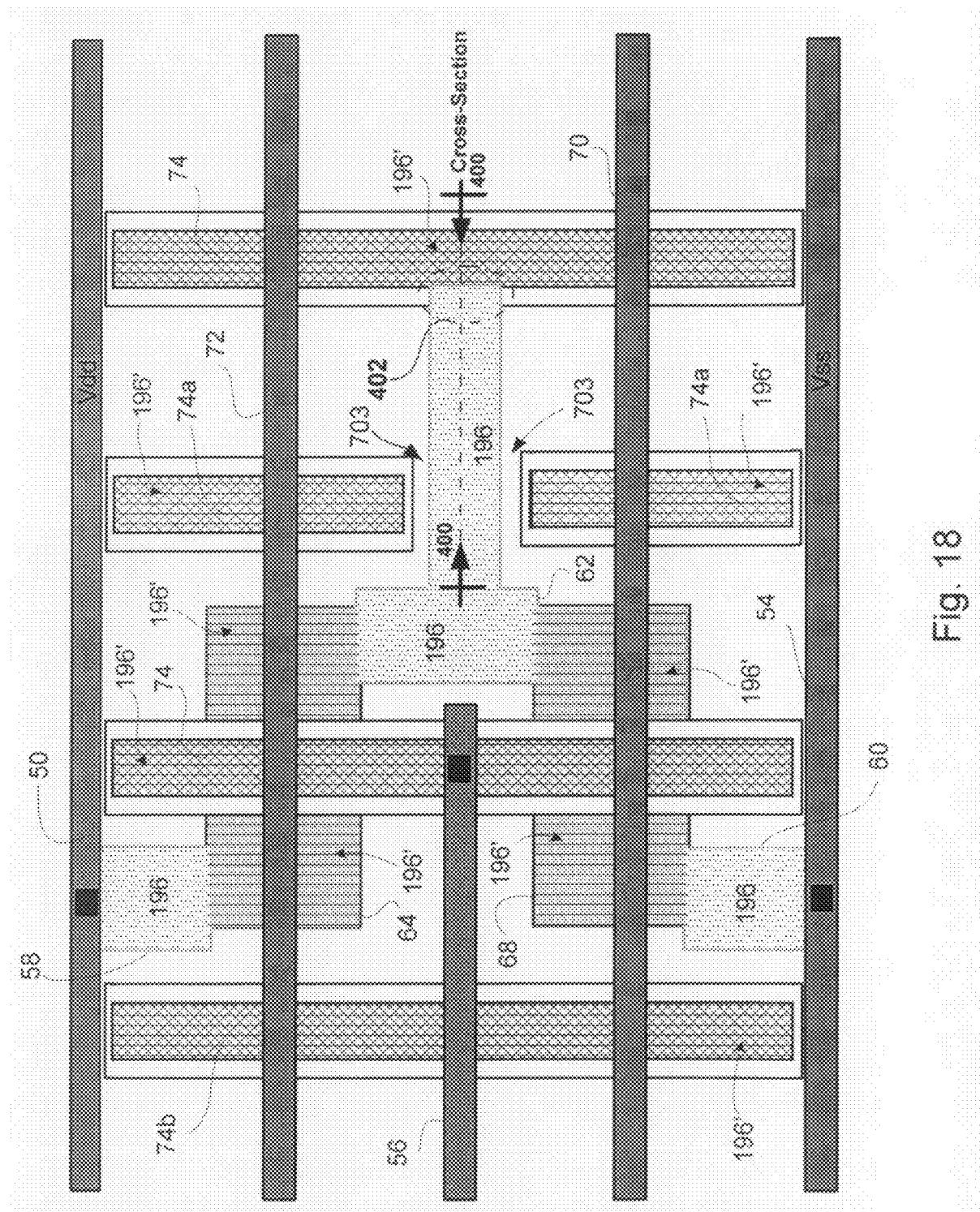
FIG. 18 illustrates a plan view of an exemplary logic inverter showing the self-aligned local interconnect in a gap of a gate line and making connection to a gate upon "climbing" a spacer, in accordance with one embodiment of the present invention.

FIG. 17B shows the processing after an etching operation is used to remove the exposed hard mask layer 199. As shown, the exposed hard mask layer 199 and local interconnect layer 196 is removed, similar to the process of FIG. 11A. Now, the mask 404, the polymer layer 210, and the hard mask 199 is removed, leaving the local interconnect layer 196, as shown in FIG. 17C. FIG. 17C also shows a mask 300' that is used to protect the local interconnect layer 196 in places where it is intended to remain. The mask 300' is shown protecting up to and over to the local interconnect layer 196 in region 402. Thus, because the mask 404 was used, the local interconnect layer 106 will remain on the side wall of the spacer 230, thus allowing the resulting connection of the local interconnect layer 196 to the silicide 196' material of the gate electrode 74. As a result, the connection is made at the level of the substrate, without the need for upper metal levels and contacts, for making a connection to the gate electrode 74.

FIG. 18 shows an example use of a local interconnect layer 196, which climbs the dielectric spacer 230 to make a connection to the gate electrode 74 in Region 402. In this example, the local interconnect layer 196 (which goes over the spacer 230), makes electrical connection to the gate electrode 74. It should be understood, however, that the structures and methods used to form the connections that climb up the spacers 230 can be used in many different designs, circuits, cells, and logic interconnections.

Methods, designs, layouts, and structures have been disclosed, which define ways of using the self-aligned local interconnects. It should be kept in mind that the benefits and advantages of using these self-aligned local interconnects are not tied to any particular circuit, cell or logic. To the contrary, the disclosure of these self-aligned local interconnect methodologies and structures can be extended to any circuit layout, logic device, logic cell, logic primitive, interconnect structure, design mask, etc. And, the resulting layout, design, configuration or data used to define the self-aligned local interconnects (in any part or region of a chip, larger overall system or implementation), can be stored electronically on a file. The file can be stored on a computer readable media, and the computer readable media can be shared, transferred or communicated over a network, such as the Internet.

Therefore, with the above embodiments in mind, it should be understood that the invention may employ other variations in the fabrication process, fabrication steps, sequence of the fabrication steps, chemical used in the fabrication, processes used in the fabrication, configurations and relative positions of the various components. While this invention has been described in terms of several preferable embodiments, it will be appreciated that those skilled in the art upon reading the specifications and studying the drawings will realize various alternation, additions, permutations and equivalents thereof. It is therefore intended that the present invention includes all such alterations, additions, permutations, and equivalents as fall within the true spirit and scope of the invention.

What is claimed is:

1. A method for designing self-aligned local interconnects to be formed on a substrate, comprising:

designing diffusion regions and isolation regions in the substrate;

designing a plurality of gates in a regular and repeating alignment along a same direction over the substrate, each of the plurality of gates designed to have dielectric side spacers, wherein some of the plurality of gates extend over at least one of the diffusion regions to form active gates, and wherein some of the plurality of gates extend over isolation regions; and designing a local interconnect layer to include local interconnect features formed between dielectric side spacers of the plurality of gates, the local interconnect features being conductive and disposed over the substrate to allow electrically contact and interconnect with or to some of the diffusion regions;

wherein the local interconnect features are respectively self-aligned by the dielectric side spacers of the plurality of gates.

2. The method for designing self-aligned local interconnects to be formed on a substrate as recited in claim 1, wherein the local interconnect layer is defined at a level of the substrate, so as to enable direct contact between local interconnect features and selected diffusion regions, selected gates, or both selected diffusion regions and selected gates.

3. The method for designing self-aligned local interconnects to be formed on a substrate as recited in claim 1, wherein the local interconnect layer is etched into sections to define local interconnect features which form desired electrical interconnections between selected ones of the diffusion regions and conductive lines in a metal layer above the local interconnect layer, or to selected gates.

4. The method for designing self-aligned local interconnects to be formed on a substrate as recited in claim 1, wherein design of the plurality of gates, the diffusion regions and local interconnect layer is for making an integrated circuit device.

5. The method for designing self-aligned local interconnects to be formed on a substrate as recited in claim 1, further comprising:

directing formation of metal silicide portions in the local interconnect layer over the substrate in regions where a silicon material is exposed, including the plurality of gates;

directing formation of a hard mask over the substrate, the local interconnect layer, the metal silicide portions, the plurality of gates, the dielectric side spacers, and the diffusion regions;

directing formation of a polymer over portions of the hard mask, the polymer defined to be substantially formed between the plurality of gates;

directing removal of the hard mask and the local interconnect layer from over the plurality of gates and dielectric side spacers;

directing removal of the polymer and remaining hard mask;

directing utilization of a mask to protect portions of the local interconnect layer; and directing removal of portions of the local interconnect layer that are not protected by the mask, such that the portions of the self aligned local interconnect layer that remain form local interconnect features to enable local interconnection.

6. The method for designing self-aligned local interconnects to be formed on a substrate as recited in claim 1, wherein the local interconnect layer is defined from one of nickel, platinum, titanium, cobalt, tungsten, or a combination of nickel and platinum.

7. The method for designing self-aligned local interconnects to be formed on a substrate as recited in claim 1, wherein any one of the local interconnect features between the dielectric side spacers of the plurality of gates is defined to provide electrical connection between a diffusion region and at least one of another diffusion region, one or more of the plurality of gates, and a metal line or feature defined in a level above the local interconnect layer.

8. The method for designing self-aligned local interconnects to be formed on a substrate as recited in claim 1, wherein the local interconnect features are integrated in circuit designs of logic primitives, logic cells, and libraries of circuit designs.

9. The method for designing self-aligned local interconnects to be formed on a substrate as recited in claim 1, further comprising:

designing the local interconnect layer to include one or more gate contacting local interconnect features fog led over one or more dielectric side spacers of a given gate of the plurality of gates so as to physically connect with an electrically conductive portion of the given gate.

10. The method for designing self-aligned local interconnects to be formed on a substrate as recited in claim 2, wherein direct contact between local interconnect features and selected diffusion regions is by way of a silicide material that is formed within the local interconnect layer.

11. The method for designing self-aligned local interconnects to be formed on a substrate as recited in claim 3, wherein the local interconnect layer, when designed to include a given local interconnect feature connected between a metal layer above and a particular one of the diffusion regions, is partially silicided at a location where the given local interconnect feature is over the particular one of the diffusion regions.

12. In a partially fabricated integrated circuit on a substrate, the partially fabricated integrated circuit includes a plurality of transistors, each of the plurality of transistors being separated from each other by a shallow trench isolation (STI) region and each of the plurality of transistors includes a drain, a source, a plurality of dielectric spacers, and a gate electrode, a method of fabricating self-aligned local interconnects for connecting at least one of the drain or the source to other components of the partially fabricated integrated circuit is provided, the method comprising:

depositing a local interconnect layer of a metal, that is suitable for fabrication of local interconnects, over the substrate and directly over the drain and source of the plurality of transistors;

forming a silicide layer in portions of the local interconnect layer by reacting the local interconnect layer with silicon of the drain and source and polysilicon through a rapid thermal anneal (RTA) at a temperature in a range of about 200-400 degree Celsius, for a time in a range of about 5-60 seconds;

depositing a hard mask layer;

applying a polymer over the hard mask layer;

removing the polymer from over the gate electrode by etching back the polymer, down to a level approximately even with a top of the gate electrode;

removing the polymer from around the dielectric spacers through an isotropic etch, wherein the polymer remains self-aligned between the dielectric spacers;

removing the hard mask layer and the local interconnect layer from the dielectric spacers and the top of the gate electrode; and patterning and etching away portions of the local interconnect layer so that local interconnect layer remains to make electrical connection to the silicide layer of selected source and drains of the transistors and metal features in a metal-1 conductive layer.

13. The method as recited in claim 12, wherein removing the hard mask layer and the local interconnect layer further comprises, removing the hard mask and the local interconnect layer from strip areas that run alongside the dielectric spacers, the strip areas having a width that is sufficient to provide electrical isolation between the local interconnect layer remaining between the dielectric spacers.

14. The method as recited in claim 12, further comprising, annealing at a temperature in a range of about 350-550 degree Celsius for a time in a range of about 20-40 seconds after the steps of patterning and etching.

15. The method as recited in claim 14, wherein the metal in the local interconnect layer consists predominantly of one of nickel, titanium, platinum, cobalt, or a combination of nickel and platinum.

16. The method as recited in claim 14, wherein the reacting is done at about 350 degree Celsius.

17. The method as recited in claim 14, wherein the partially fabricated integrated circuit is a partially fabricated digital logic cell, and the partially fabricated digital logic cell includes at least a PMOS transistor and a NMOS transistor.

18. The method as recited in claim 14, wherein the local interconnect layer that remains provides direct silicided connections to a diffusion of the PMOS transistor or a diffusion of the NMOS transistor, or to a Vdd or Vss metal line in an upper metal-1 layer by way of a conductive via.

19. The method as recited in claim 16, wherein the reacting is done for about 30 seconds.

* * * * *